US012800968B2

(12) United States Patent
Kim et al.

(10) Patent No.: US 12,800,968 B2
(45) Date of Patent: Nov. 17, 2026

(54) DISPLAY PANEL, DISPLAY APPARATUS INCLUDING DISPLAY PANEL, AND METHOD FOR MANUFACTURING DISPLAY PANEL

(71) Applicant: SAMSUNG ELECTRONICS CO., LTD., Suwon-si (KR)

(72) Inventors: Bupmyoung Kim, Suwon-si (KR); Sungho Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 356 days.

(21) Appl. No.: 18/391,148

(22) Filed: Dec. 20, 2023

(65) Prior Publication Data

US 2024/0288734 A1 Aug. 29, 2024

Related U.S. Application Data

(63) Continuation of application No. PCT/KR2023/018579, filed on Nov. 17, 2023.

(30) Foreign Application Priority Data

Feb. 24, 2023 (KR) ........................ 10-2023-0025402

(51) Int. Cl.
*G02F 1/13* (2006.01)
*G02F 1/1345* (2006.01)
(Continued)

(52) U.S. Cl.
CPC ....... *G02F 1/13452* (2013.01); *H10D 86/441* (2025.01); *H10D 86/60* (2025.01);
(Continued)

(58) Field of Classification Search
CPC ........... G02F 1/13452; G02F 1/136286; G02F 1/1368; H10D 86/441; H10D 86/60; H10W 70/688; H10W 70/611
(Continued)

(56) References Cited

U.S. PATENT DOCUMENTS 8,242,615 B2 8/2012 Takahashi
9,398,686 B2 7/2016 Shin et al.
(Continued)

FOREIGN PATENT DOCUMENTS

CN 114397776 A 4/2022
JP 4378387 B2 12/2009
(Continued)

OTHER PUBLICATIONS

International Search Report (PCT/ISA/210) issued Mar. 4, 2024 by the International Searching Authority in International Patent Application No. PCT/KR2023/018579.
(Continued)

*Primary Examiner* — Binh B Tran
(74) *Attorney, Agent, or Firm* — Sughrue Mion, PLLC

(57) ABSTRACT

A display apparatus includes a substrate including an active area including a plurality of pixels, and an outer lead bonding (OLB) area; a first Chip On Film (COF) coupled to the OLB area; a second COF coupled to the OLB area and adjacent to the first COF; a first printed circuit board (PCB) coupled to the first COF; and a second PCB coupled to the second COF, wherein the OLB area may include a first area to which the first COF is coupled, a second area to which the second COF is coupled, and a dummy area between the first area and the second area, and the dummy area may include a conductive pattern electrically connecting the first COF and the second COF.

13 Claims, 15 Drawing Sheets

(51) Int. Cl.

| | |
|---|---|
| ***H10D 86/40*** | (2025.01) |
| ***H10D 86/60*** | (2025.01) |
| *G02F 1/1362* | (2006.01) |
| *G02F 1/1368* | (2006.01) |
| *H10W 70/60* | (2026.01) |
| *H10W 70/67* | (2026.01) |

(52) U.S. Cl.
CPC ...... *G02F 1/136286* (2013.01); *G02F 1/1368* (2013.01); *H10W 70/611* (2026.01); *H10W 70/688* (2026.01)

(58) Field of Classification Search
USPC .......................................................... 361/749
See application file for complete search history.

(56) References Cited

U.S. PATENT DOCUMENTS

| | | | | |
|---|---|---|---|---|
| 10,429,684 | B2 | 10/2019 | Naas et al. | |
| 10,561,022 | B2 * | 2/2020 | Kwon | H05K 1/147 |
| 10,714,508 | B2 | 7/2020 | Lee et al. | |
| 10,928,664 | B2 | 2/2021 | Wang | |
| 11,181,762 | B2 | 11/2021 | Jeon et al. | |
| 11,282,862 | B2 | 3/2022 | Ye | |
| 11,287,679 | B2 | 3/2022 | Lee et al. | |
| 11,868,013 | B2 | 1/2024 | Tang et al. | |
| 2008/0278428 | A1 * | 11/2008 | Song | G09G 3/3696 345/98 |
| 2020/0348573 | A1 * | 11/2020 | Shin | G02F 1/136286 |
| 2021/0200006 | A1 | 7/2021 | Ryu et al. | |
| 2023/0090484 | A1 | 3/2023 | Maeng et al. | |
| 2023/0119961 | A1 * | 4/2023 | Ha | H10W 40/251 257/659 |
| 2024/0103325 | A1 | 3/2024 | Han et al. | |

FOREIGN PATENT DOCUMENTS

| | | | |
|---|---|---|---|
| JP | 2017-528767 | A | 9/2017 |
| KR | 10-2010-0075215 | A | 7/2010 |
| KR | 10-1478290 | B1 | 1/2015 |
| KR | 10-2015-0097849 | A | 8/2015 |
| KR | 10-2017-0118509 | A | 10/2017 |
| KR | 10-2019-0088151 | A | 7/2019 |
| KR | 10-2020-0019813 | A | 2/2020 |
| KR | 10-2020-0113104 | A | 10/2020 |
| KR | 10-2020-0122460 | A | 10/2020 |
| KR | 10-2021-0108524 | A | 9/2021 |
| KR | 10-2022-0105630 | A | 7/2022 |
| KR | 10-2024-0043008 | A | 4/2024 |
| KR | 10-2680402 | B1 | 7/2024 |
| WO | 2020/036277 | A1 | 2/2020 |

OTHER PUBLICATIONS

Written Opinion (PCT/ISA/237) issued Mar. 4, 2024 by the International Searching Authority in International Patent Application No. PCT/KR2023/018579.

* cited by examiner

DISPLAY PANEL, DISPLAY APPARATUS INCLUDING DISPLAY PANEL, AND METHOD FOR MANUFACTURING DISPLAY PANEL

CROSS-REFERENCE TO RELATED APPLICATIONS

This application is a by-pass continuation application of International Application No. PCT/KR2023/018579, filed on Nov. 17, 2023, which is based on and claims priority to Korean Patent Application No. 10-2023-0025402, filed on Feb. 24, 2023, in the Korean Intellectual Property Office, the disclosures of which are incorporated by reference herein in their entireties.

BACKGROUND

1. Field

The disclosure relates to a display panel, a display apparatus including the display panel, and a method for manufacturing the display panel.

2. Description of Related Art

A display apparatus is an output device that converts obtained or stored electrical information into visual information and displays the visual information to a user.

Display apparatuses include, for example, a monitor device connected to a personal computer or a server computer, a portable computer device, a navigation terminal device, a general television device, Internet Protocol television (IPTV), portable terminal devices such as a smartphone, tablet personal computer (PC), a personal digital assistant (PDA), or a cellular phone, various display apparatuses used to reproduce images such as advertisements or movies in an industrial field, or various kinds of audio/video systems.

A display apparatus includes a display panel to convert electrical information into visual information.

A liquid crystal display (LCD) is a light receiving display apparatus that requires a light source apparatus supplying light from the rear of a display panel and the display panel acting as a switch to pass/block light and changing the supplied light to a desired color.

Recently, as the size of display apparatuses increase or the shapes (e.g., curved) of the display apparatuses becomes more diverse, various types of electronic components are required to drive the display panel.

SUMMARY

Provided are a display panel in which a number of electronic components for driving the display panel may be reduced, a display apparatus including the display panel, and a method for manufacturing the display panel.

Further, provided are a display panel in which failure of electronic components for driving the display panel may be prevented, a display apparatus including the display panel, and a method for manufacturing the display panel.

Further still, provided are a display panel in which an increase in a cost of the display apparatus due to electronic components for driving the display panel may be prevented, a display apparatus including the display panel, and a method for manufacturing the display panel.

Additional aspects will be set forth in part in the description which follows and, in part, will be apparent from the description, or may be learned by practice of the presented embodiments.

According to an aspect of the disclosure, a display panel includes: a substrate including an active area including a plurality of pixels, and an outer lead bonding (OLB) area: a first Chip On Film (COF) coupled to the OLB area: a second COF coupled to the OLB area and adjacent to the first COF: a first printed circuit board (PCB) coupled to the first COF; and a second PCB coupled to the second COF, wherein the OLB area may include a first area to which the first COF is coupled, a second area to which the second COF is coupled, and a dummy area between the first area and the second area, and the dummy area may include a conductive pattern electrically connecting the first COF and the second COF.

Each of the first COF and the second COF may include: a plurality of signal pins configured to output signals for driving the plurality of pixels; and a plurality of dummy pins, and the plurality of dummy pins of the first COF may be electrically connected to the plurality of dummy pins of the second COF through the conductive pattern.

Each of the plurality of signal pins may be provided between the plurality of dummy pins.

The first COF may be configured to transmit a power signal to the second COF through the conductive pattern, and the second COF may be configured to transmit the power signal to the second PCB.

The first COF may be configured to transmit a data signal to the second COF through the conductive pattern, and the second COF may be configured to transmit the data signal to the second PCB.

The display panel may further include a third COF coupled to the OLB area and the first PCB, the substrate may include a gate line configured to transmit a gate signal to the plurality of pixels, and the gate line may be electrically connected to the third COF.

The display panel may further include: a third PCB; a third COF coupled to the OLB area and the second PCB; and a fourth COF coupled to the OLB area and the third PCB, the OLB area may include a third area to which the third COF is coupled, a fourth area to which the fourth COF is coupled, and the dummy area between the third area and the fourth area, and the dummy area may include a conductive pattern electrically connecting the third COF and the fourth COF.

Each of the first COF and the second COF may include a source integrated circuit (IC) chip.

The second PCB may be configured to receive a signal from the first PCB through the first COF, the conductive pattern and the second COF.

According to an aspect of the disclosure, a display apparatus includes: a first substrate including a timing controller: a second substrate including an active area including a plurality of pixels, and an outer lead bonding (OLB) area: a first chip on film (COF) coupled to the OLB area: a second COF coupled to the OLB area and adjacent to the first COF: a first printed circuit board (PCB) coupled to the timing controller and the first COF; and a second PCB coupled to the second COF, wherein the OLB area may include a first area to which the first COF is coupled, a second area to which the second COF is coupled, and a dummy area between the first area and the second area, and the dummy area may include a conductive pattern electrically connecting the first COF and the second COF.

Each of the first COF and the second COF may include: a plurality of signal pins configured to output signals for driving the plurality of pixels; and a plurality of dummy pins, and the plurality of dummy pins of the first COF may be electrically connected to the plurality of dummy pins of the second COF through the conductive pattern.

Each of the plurality of signal pins may be provided between the plurality of dummy pins.

The first substrate may further include a power board coupled to the first PCB, the power board may be configured to transmit a power signal to the first PCB, the first COF may be configured to transmit the power signal to the second PCB through the conductive pattern, and the second COF may be configured to transmit the power signal to the second PCB.

The timing controller may be configured to transmit a data signal to the first PCB, the first COF may be configured to transmit the data signal to the second COF through the conductive pattern, and the second COF may be configured to transmit the data signal to the second PCB.

The display apparatus may further include a third COF coupled to the OLB area and the first PCB, the second substrate may include a gate integrated circuit (IC) configured to transmit a gate signal to the plurality of pixels, and the gate IC may be electrically connected to the third COF.

According to an aspect of the disclosure, a method for manufacturing a display panel, includes: disposing a plurality of pixels in an active area of a substrate; coupling a plurality of chip on films (COFs) to a fan-out area in an outer lead bonding (OLB) area; forming a conductive pattern in a dummy area surrounded by the fan-out area in the OLB area; coupling a first printed circuit board (PCB) to a first COF, coupled to one side of the fan-out area based on the dummy area, among the plurality of COFs; and coupling a second PCB to a second COF, coupled to another side of the fan-out area based on the dummy area, among the plurality of COFs.

The OLB area may include a plurality of fan-out areas coupled to the plurality of COFs.

The plurality of COFs may be configured to output signals corresponding to a data values of the plurality of pixels through a conductive pattern formed in the fan-out area.

The conductive pattern may be electrically connected to the first COF.

The second COF may be formed in the dummy area between the fan-out area corresponding to the first COF.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
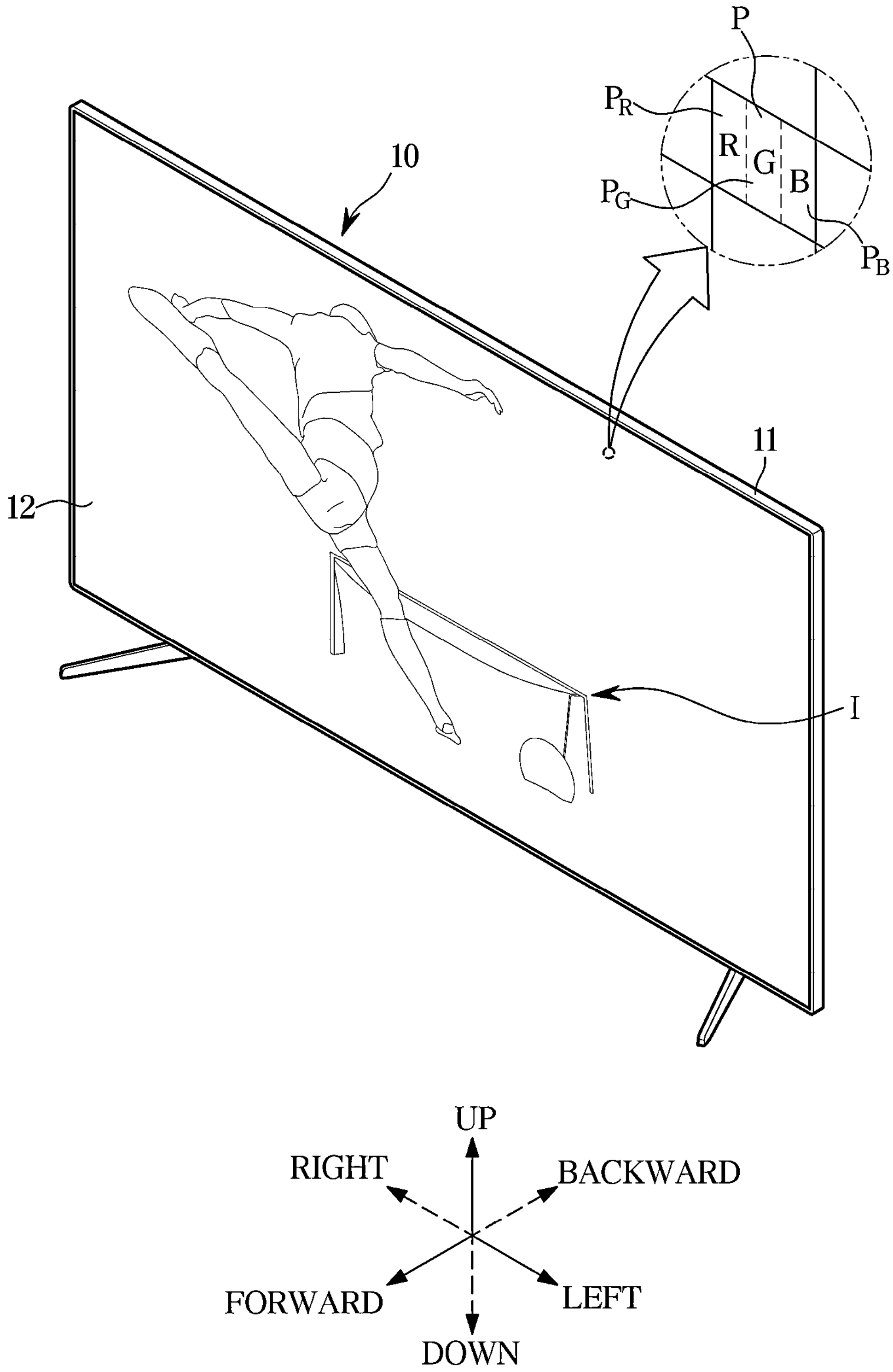
FIG. 1 is a perspective view of a display apparatus according to an embodiment.

Embodiments described in the specification and configurations shown in the accompanying drawings are merely examples of the disclosure, and various modifications may replace the embodiments and the drawings of the disclosure at the time of filing of the application.

The terms used herein are only for the purpose of describing particular embodiments and are not intended to limit to the disclosure.

For example, a singular form of a noun corresponding to an item may include one item or a plurality of the items unless context clearly indicates otherwise.

Further, it should be further understood that the terms "include," and/or "have," specify the presence of stated features, integers, steps, operations, elements, components, and/or groups thereof, but do not preclude the presence or addition of one or more other features, integers, steps, operations, elements, components, and/or groups thereof.

Further, it should be understood that, although the terms "first," "second," etc. may be used herein to describe various elements, the elements are not restricted by the terms, and the terms are only used to distinguish one element from another.

Further, the terms such as "~part", "~device", "~block", "~member", "~module", and the like may refer to a unit for processing at least one function or act. For example, the terms may refer to at least one process processed by at least one hardware, such as field-programmable gate array (FPGA/application specific integrated circuit (ASIC, software stored in memories or processors.

Hereinafter, embodiments of the disclosure is described in detail with reference to the accompanying drawings. Like reference numerals or symbols denoted in the drawings of the specification represent members or components that perform the substantially same functions.

FIG. 1 is a perspective view of a display apparatus according to an embodiment.

Referring to FIG. 1, a display apparatus 10 is a device capable of processing an image signal received from an external source and visually displaying a processed image. Hereinafter, an embodiment in which the display apparatus 10 is a television (TV) is described, but embodiments of the disclosure are not limited thereto. For example, the display apparatus 10 may be a monitor, a portable multimedia device, a portable communication device, and the like. The form of the display apparatus 10 is not limited provided it is a device that visually displays an image.

In an embodiment, the display apparatus 10 may be a large format display (LFD) installed either outdoors or indoors.

Further, the display apparatus 10 may be a Curved Display Apparatus curved display apparatus in which at least a portion of an edge with a curvature.

The display apparatus 10 may receive content including a video signal and an audio signal from various content sources, and output video and audio corresponding to the video signal and the audio signal, respectively. For example, the display apparatus 10 may receive content data through a broadcast reception antenna or a wired cable, receive content data from a content playback apparatus, or receive content data from a content-providing server of a content provider.

As shown in FIG. 1, the display apparatus 10 may include a body 11 and a screen 12 for displaying an image I.

The body 11 forms an exterior of the display apparatus 10. The interior of the body 11 may provide components of the display apparatus 10 for displaying the image I and performing various functions. In the embodiment shown in FIG. 1 that the body 11 has a flat plate shape, but the shape of the body 11 is not limited to that shown in FIG. 1. For example, the body 11 may have a curved plate shape.

The screen 12 is formed on a front surface of the body 11, and display the image I. For example, the screen 12 may display a still image or a video, as well as a two-dimensional (2D) plane image or a three-dimensional (3D) stereoscopic image using binocular parallax of a user.

The screen 12 may include a display panel capable of transmitting or blocking light emitted by a light source apparatus, or the like.

A plurality of pixels P may be formed on the screen 12, and the image I displayed on the screen 12 may be formed by light emitted from each of the plurality of pixels P. For example, the image I may be formed on the screen 12 by combining light emitted from the plurality of pixels P like a mosaic.

Each of the plurality of pixels P may emit light of various brightness and various colors. In order to emit light of various colors, each of the plurality of pixels P may include sub-pixels $P_R$, $P_G$, and $P_B$.

The sub-pixels $P_R$, $P_G$, and $P_B$ may include a red sub-pixel $P_R$ capable of emitting red light, a green sub-pixel $P_G$ capable of emitting green light, and a blue sub-pixel $P_B$ capable of emitting blue light. For example, the red light may represent light having a wavelength of approximately 700 nm (nanometers, one billionth of a meter) to 800 nm, the green light may represent light having a wavelength of approximately 500 nm to 600 nm, and the blue light may represent light having a wavelength of approximately 400 nm to 500 nm.

By combining the red light of the red sub-pixel $P_R$, the green light of the green sub-pixel $P_G$, and the blue light of the blue sub-pixel $P_B$, each of the plurality of pixels P may emit light of various brightness and various colors.

Figure 2:
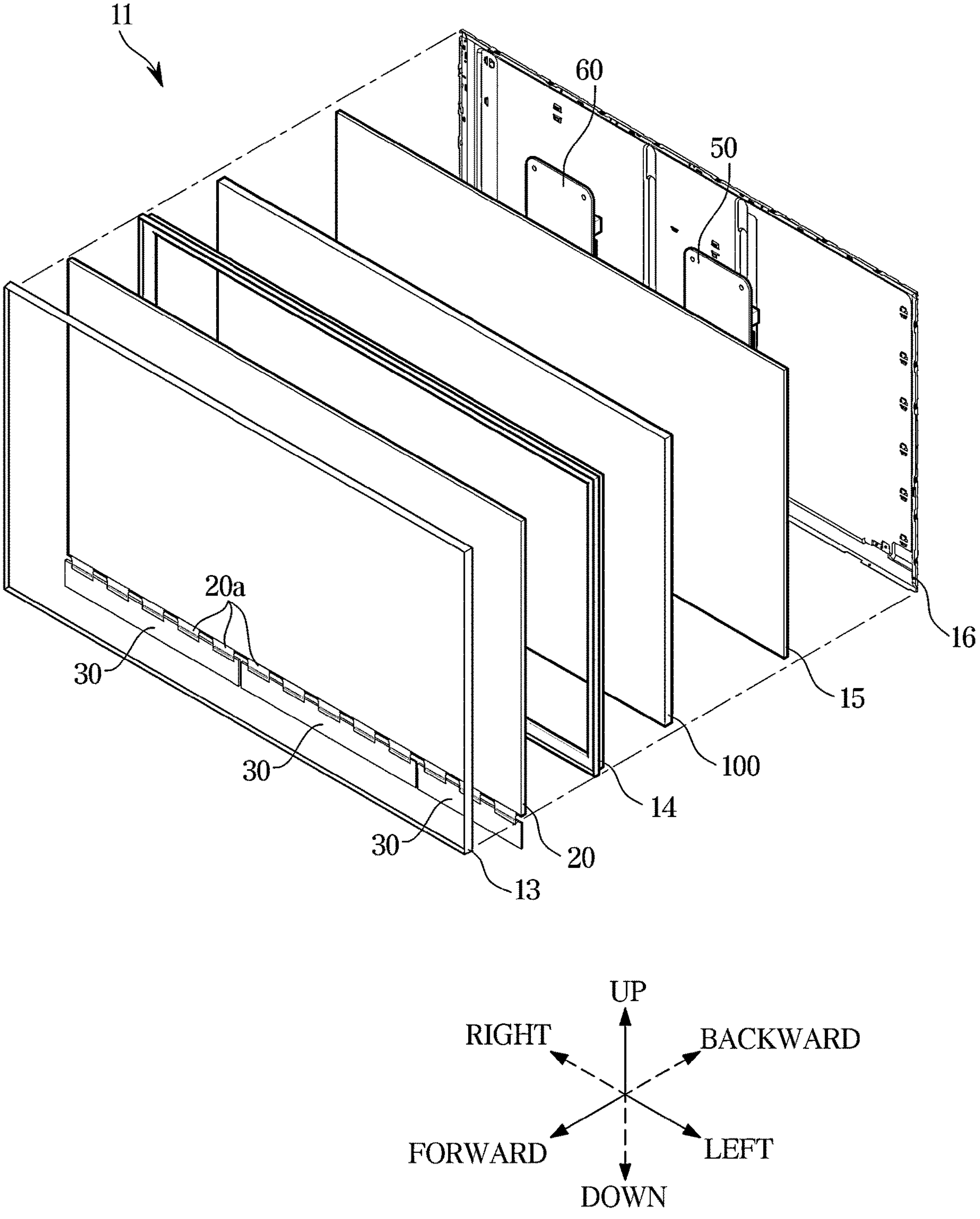
FIG. 2 is an exploded perspective view of a display apparatus according to an embodiment.
Figure 3:
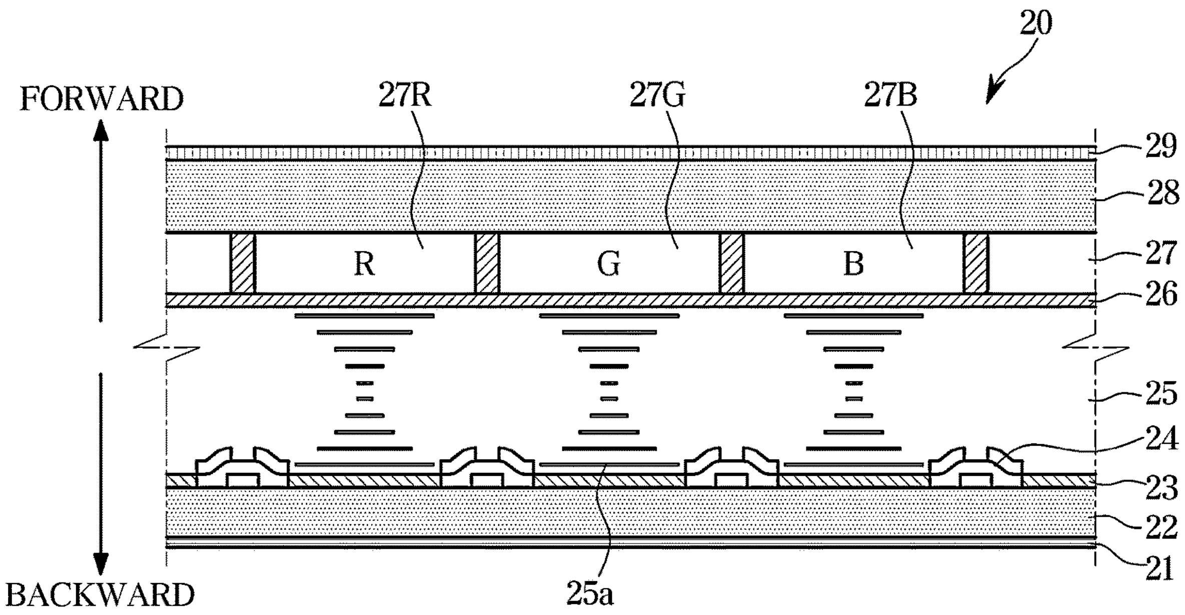
FIG. 3 is a cross-sectional view of a display panel included in a display apparatus according to an embodiment.

FIG. 2 is an exploded perspective view of a display apparatus according to an embodiment. FIG. 3 is a cross-sectional view of a display panel included in a display apparatus according to an embodiment.

As shown in FIG. 2, various components for generating an image I on the screen 12 may be provided in the body 11.

For example, the body 11 may include a light source apparatus 100, a display panel 20 blocking or transmitting light emitted from the light source apparatus 100, a control board 50 controlling operations of the light source apparatus 100 and the display panel 20, and a power board 60 supplying power to the light source apparatus 100 and the display panel 20. In addition, the body 11 may include a bezel 13, a frame middle mold 14, a bottom chassis 15, and a rear substrate 16 for supporting the display panel 20, the light source apparatus 100, the control board 50, and the power board 60.

The rear substrate 16 may include a rear cover forming a rear of the display apparatus 10.

According to one or more embodiments, the light source apparatus 100 may include a point light source that emits white light, and may refract, reflect, and scatter the light to convert the light emitted from the point light source into a uniform surface light. As described above, the light source apparatus 100 may refract, reflect, and scatter the light emitted from the point light source to emit a uniform surface light in a forward direction.

The display panel 20 may be provided in front of the light source apparatus 100, and may block or transmit light emitted from the light source apparatus 100 to form the image I.

A front surface of the display panel 20 may form the screen 12 of the display apparatus 10 described above, and the display panel 20 may form the plurality of pixels P. The plurality of pixels P of the display panel 20 may independently block or transmit the light emitted from the light source apparatus 100. The light transmitted through the plurality of pixels P may form the image I to be displayed on the screen 12.

According to an embodiment, as shown in FIG. 3, the display panel 20 may include a first polarizing film 21, a first substrate 22, a pixel electrode 23, a thin-film transistor (TFT) 24, a liquid crystal layer 25, a common electrode 26, a color filter 27, a second substrate 28, and a second polarizing film 29.

The first substrate 22 and the second substrate 28 may be transparent.

The first substrate 22 and the second substrate 28 may fixedly support the pixel electrode 23, the thin-film transistor 24, the liquid crystal layer 25, the common electrode 26, and the color filter 27. The first and second transparent substrates 22 and 28 may be formed of tempered glass or transparent resin.

The first polarizing film 21 and the second polarizing film 29 may be provided on outer sides of the first and second substrates 22 and 28, respectively. The first polarizing film 21 and the second polarizing film 29 may each transmit specific polarized light and block (reflect or absorb) the other polarized light. For example, the first polarizing film 21 may transmit light polarized in a first direction and block, reflect, or absorb the other polarized light. In addition, the second polarizing film 29 may transmit light polarized in a second direction and block, reflect, or absorb the other polarized light. In this instance, the first direction and the second direction may be orthogonal to each other. Thus, the polarized light passing through the first polarizing film 21 may not directly pass through the second polarizing film 29.

The color filter 27 may be provided on an inner side of the second substrate 28. The color filter 27 may include, for example, a red filter 27R transmitting red light, a green filter 27G transmitting green light, and a blue filter 27B transmitting blue light. In addition, the red filter 27R, the green filter 27G, and the blue filter 27B may be provided parallel to each other. A region occupied by the color filter 27 may correspond to the pixel P described above. A region occupied by the red filter 27R may correspond to the red sub-pixel $P_R$, a region occupied by the green filter 27G may correspond to the green sub-pixel $P_G$, and a region occupied by the blue filter 27B may correspond to the blue sub-pixel $P_B$.

The pixel electrode 23 may be provided on the first substrate 22, and the common electrode 26 may be provided on an inner side of the second substrate 28. The pixel electrode 23 and the common electrode 26 may be formed of a metal material through which electricity is conducted and may generate an electric field for changing the arrangement of liquid crystal molecules 115*a* constituting the liquid crystal layer 25 to be described below.

The TFT 24 may be provided on the first substrate 22. The thin-film transistor 24 may be turned on (closed) or off (opened) by image data provided from a Chip On Film (COF) 20*a* including a printed circuit board (PCB) 30 and/or a source integrated circuit (IC). In addition, by turning the thin-film transistor 24 on (closing) or off (opening), an electric field may be formed or removed from between the pixel electrode 23 and the common electrode 26.

The liquid crystal layer 25 may be formed between the pixel electrode 23 and the common electrode 26 and may be filled with liquid crystal molecules 25*a*. The liquid crystal may represent an intermediate state between a solid crystal and a liquid. The liquid crystal may exhibit optical properties depending on a change of the electric field. For example, an arrangement direction of the molecules constituting the liquid crystal may change depending on the change of the electric field. As a result, optical properties of the liquid crystal layer 25 may change according to the presence or absence of the electric field passing through the liquid crystal layer 25. For example, the liquid crystal layer 25 may rotate a polarization direction of light about an optical axis according to the presence or absence of the electric field. Accordingly, the polarized light that has passed through the first polarizing film 21 may be changed in polarization direction while passing through the liquid crystal layer 25 and may pass through the second polarizing film 29.

In one side of the display panel 20, the COF 20*a* outputting signals for driving a plurality of pixels P to the display panel 20, and the PCB 30 transmitting the signal to the COF 20*a* may be provided.

According to one or more embodiments, the PCB 30 may be a source PCB including a data driver.

The COF 20*a* and/or the PCB 30 may include a Display Driver Integrated Circuit (DDIC) that processes digital image data and outputs an analog image signal.

According to one or more embodiments, the display panel 20 may include a plurality of COFs 20*a* and a plurality of PCBs 30.

Each of the plurality of PCBs 30 may be coupled to the plurality of COFs 20*a*.

According to one or more embodiments, the number of COFs 20*a* connected to each of the plurality of PCBs 30 may vary.

The PCB 30 may be electrically coupled to the control board 50 and/or the power board 60. Accordingly, the PCB 30 may electrically connect the display panel 20 and the control board 50 and/or the power board 60.

According to one or more embodiments, the control board 50 may include a connector 50*a* for coupling to the PCB 30. In an embodiment, the control board 50 may be connected to the PCB 30 directly through the connector 50*a*, or may be connected to the PCB 30 through a control PCB connected to the connector 50*a*.

According to various embodiments, the power board 60 may include a connector 60*a* for coupling to the PCB 30. In an embodiment, the power board 60 may be connected to the PCB 30 directly through the connector 60*a*, or may be connected to the PCB 30 through a power PCB connected to the connector 60*a*.

According to one or more embodiments, only at least one PCB 30 among the plurality of PCBs 30 may be connected to the control board 50 and/or the power board 60.

The plurality of COFs 20*a* may each include a source IC chip, provided on a flexible film that is bendable to drive a plurality of pixels P, and a plurality of pins electrically connectable to the plurality of pixels P and the PCB 30.

The PCB 30 may receive image data and power from the control board 50/power board 60. In addition, the PCB 30 may provide a data signal and a power signal to the display panel 20 through the COF 20*a*. The data signal may refer to an image signal, and the power signal may refer to a driving current.

The control board 50 may include a control circuit that controls operations of the display panel 20 and/or the light source apparatus 100. For example, the control circuit may process a video signal and/or an audio signal received from an external content source, transmit image data to the display panel 20, and transmit dimming data to the light source apparatus 100.

The power board 60 may include a power supply circuit supplying power to the display panel 20 and/or the light source apparatus 100. The power supply circuit may supply power to the control board 50, the light source apparatus 100, and/or the display panel 20.

The control board 50 and the power board 60 may be implemented with various circuit boards. For example, the power board 60 may include a condenser, a coil, a resistance element, a processor, and the like and a power supply circuit board on which these elements are mounted. In addition, the control board 50 may include a memory, a processor, and a control circuit board on which these elements are mounted.

The control board 50 and the power board 60 may be coupled to at least one of the plurality of PCBs 30.

Figure 4:
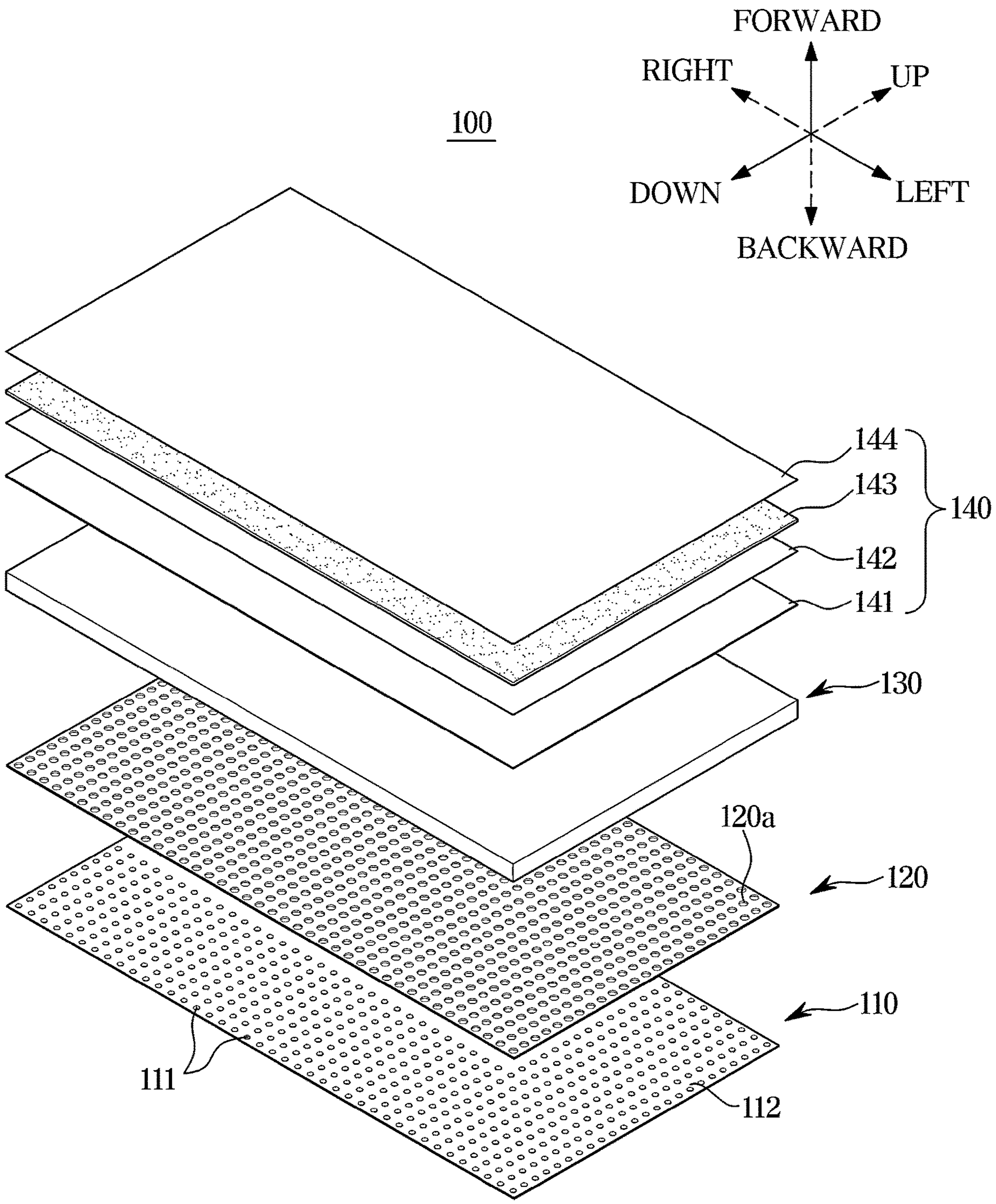
FIG. 4 is an exploded perspective view of a light source apparatus included in a display apparatus according to an embodiment.

FIG. 4 illustrates an example of the light source apparatus included in a display apparatus according to an embodiment.

As shown in FIG. 4, the light source apparatus 100 may include a light source module 110 generating light, a reflector sheet 120 reflecting light, a diffuser plate 130 uniformly diffusing light, and an optical sheet 140 improving luminance of the output light.

The light source module 110 may include a plurality of light sources 111 emitting light, and a substrate 112 fixedly supporting the plurality of light sources 111.

The plurality of light sources 111 may be arranged in a predetermined pattern to allow light to be emitted with uniform luminance. The plurality of light sources 111 may be arranged to allow a distance between a single light source and each light source adjacent thereto to be the same.

For example, as shown in FIG. 4, the plurality of light sources 111 may be aligned/arranged in rows and columns. For example, the plurality of light sources may be arranged to form an approximate square by four adjacent light sources. In addition, any one light source is adjacent to four light sources, and a distance between the single light source and each of the four light sources adjacent thereto may be substantially the same.

According to one or more embodiment, the plurality of light sources 111 may be arranged to allow an approximately equilateral triangle to be formed by three adjacent light sources. In this instance, a single light source may be adjacent to six light sources, and a distance between the single light source and each of the six adjacent light sources may be approximately the same.

However, the arrangement of the plurality of light sources 111 is not limited to that described above, and the plurality of light sources 111 may be arranged in various patterns to allow light to be emitted with uniform luminance.

The light source 111 may employ an element capable of emitting monochromatic light (light having a specific range of wavelengths, for example, blue light) or white light (for example, mixed light of red light, green light, and blue light) in various directions by receiving power. For example, the light source 111 may include a light-emitting diode (LED). The LED may be implemented in a variety of sizes and may include, for example, mini LEDs and/or micro LEDs.

The substrate 112 may fix the plurality of light sources 111 to prevent positions of the light sources 111 from being changed. In addition, the substrate 112 may supply each light source 111 with power for the light source 111 to emit light.

The substrate 112 may fix the plurality of light sources 111. The substrate 112 may include a synthetic resin and/or tempered glass and/or a circuit board on which a conductive power feed line for supplying power to the light source 111 is formed.

The reflector sheet 120 may allow light emitted from the plurality of light sources 111 to be reflected forward or in a direction close to the forward direction.

A plurality of through holes **120*a* corresponding respectively to the plurality of light sources 111 of the light source module 110 may be formed in the reflector sheet 120. The light sources 111 of the light source module 110 may pass through the through holes 120*a* and protrude forward of the reflector sheet 120**.

For example, in an assembly process of the reflector sheet 120 and the light source module 110, the plurality of light sources 111 of the light source module 110 are inserted into the plurality of through holes **120*a* formed in the reflector sheet 120. As a result, the substrate 112 of the light source module 110 may be located on the rear of the reflector sheet 120, but the plurality of light sources 111 of the light source module 110 may be located on the front of the reflector sheet 120**.

Accordingly, the plurality of light sources 111 may emit light in front of the reflector sheet 120.

The plurality of light sources 111 may emit light in front of the reflector sheet 120 in various directions. Light may be emitted from the light source 111 not only toward the diffuser plate 130, but also toward the reflector sheet 120, and the reflector sheet 120 may reflect the light emitted toward the reflector sheet 120 toward the diffuser plate 130.

The light emitted from the light source 111 may pass various objects, such as the diffuser plate 130, the optical sheet 140, and the like. When the light passes the diffuser plate 130 and the optical sheet 140, a portion of the incident light is reflected from surfaces of the diffuser plate 130 and the optical sheet 140. The reflector sheet 120 may reflect the light reflected by the diffuser plate 130 and the optical sheet 140.

The diffuser plate 130 may be provided in front of the light source module 110 and the reflector sheet 120 to uniformly disperse the light emitted from the light source 111 of the light source module 110.

As described above, the plurality of light sources 111 may be located everywhere on a rear surface of the light source apparatus 100. The plurality of light sources 111 are equidistantly arranged on the rear surface of the light source apparatus 100, but differences in luminance may exist depending on the positions of the plurality of light sources 111.

To eliminate the difference in luminance due to the plurality of light sources 111, the diffuser plate 130 may diffuse the light emitted from the plurality of light sources 111 within the diffuser plate 130. In other words, the diffuser plate 130 may uniformly emit non-uniform light forward from the plurality of light sources 111.

The optical sheet 140 may include various sheets for improving luminance or luminance uniformity. For example, the optical sheet 140 may include a diffuser sheet 141, a first prism sheet 142, a second prism sheet 143, a reflective polarizing sheet 144, and the like.

The diffuser sheet 141 diffuses light for uniformity of luminance. The light emitted from the light source 111 may be diffused by the diffuser plate 130 and then diffused again by the diffuser sheet 141 included in the optical sheet 140.

The first and second prism sheets 142 and 143 may concentrate the light diffused by the diffuser sheet 141, thereby increasing the luminance. The first and second prism sheets 142 and 143 may have triangular prism patterns arranged adjacent to each other to form a plurality of bands.

The reflective polarizing sheet 144 may be a kind of polarizing film, and may transmit a portion of the incident light, and reflect other portions to improve luminance. For example, the reflective polarizing sheet 144 may transmit light polarized in the same direction as a predetermined polarization direction of the reflective polarizing sheet 144 and reflect light polarized in a different direction from the predetermined polarization direction. In addition, the light reflected by the reflective polarizing sheet 144 may be recycled within the light source apparatus 100, and such light recycle may improve the luminance of the display apparatus 10.

The optical sheet 140 is not limited to the sheets or films shown in FIG. 4, and may further include a variety of sheets or films such as protective sheets, films, and the like.

The light source apparatus 100 may include the plurality of light sources 111, and may output surface light by diffusing the light emitted from the plurality of light sources 111. The display panel 20 may include a plurality of pixels, and the plurality of pixels may be controlled to allow each of the plurality of pixels to transmit and/or block light. An image I may be formed by light passing through each of the plurality of pixels.

In an embodiment, the display apparatus 10 may perform local dimming to vary a brightness of light for each region of the light source apparatus 100 in association with the output image to improve power consumption while increasing contrast.

For example, the display apparatus 10 may reduce the brightness of light of the light source 111 of the light source apparatus 100 corresponding to a dark portion of an image to make the dark portion of the image darker, and may increase the brightness of light of the light source 111 of the light source apparatus 100 corresponding to a bright portion of the image to make the bright portion of the image brighter. As a result, a contrast ratio of the image may be improved.

Figure 5:
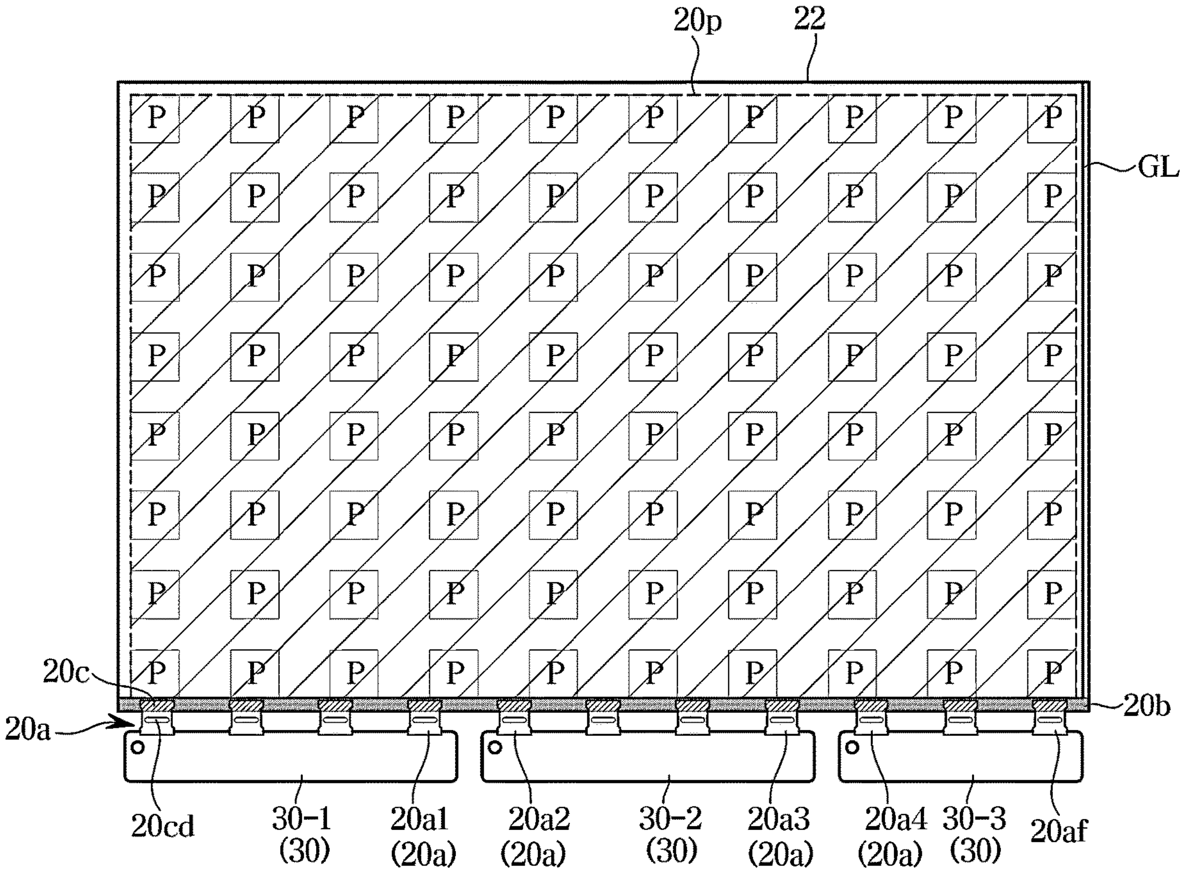
FIG. 5 schematically illustrates a top surface of a display panel according to an embodiment.

FIG. 5 schematically illustrates a top surface of a display panel according to an embodiment.

Referring to FIG. 5, the display panel according to an embodiment may include the substrate 22.

The substrate 22 may include a TFT glass substrate.

In a manufacturing process of the display panel 20 according to an embodiment, a plurality of pixels P may be provided in an active area **20*p* of the substrate 22**.

The substrate 22 may include the active area **20*p*** in which the plurality of pixels P are positioned.

In the active area **20*p*, pixel electrodes 23 corresponding to the plurality of pixels P and the TFT 24 for applying an electric field to the liquid crystal layer 25** may be provided.

In the manufacturing process of the display panel 20 according to an embodiment, the plurality of chip on films (COFs) 20*a* may be coupled to the Outer Lead Bonding (OLB) area 20*b* of the substrate 22.

According to one or more embodiments, the plurality of COFs 20*a* may be coupled to the OLB area 20*b* in an anisotropic conductive film (ACF) bonding method, without being limited thereto.

The substrate 22 may include the OLB area 20*b* to which the plurality of COFs 20*a* are coupled.

According to one or more embodiments, the OLB area 20*b* may include fan-out areas 20*c* formed to be coupled to the plurality of COFs 20*a*.

A conductive pattern may be formed in the fan-out area 20*c* to electrically connect the plurality of COFs 20*a* and the plurality of pixels P.

The plurality of COFs 20*a* may output signals corresponding to data values of the plurality of pixels P through the conductive pattern formed in the fan-out area 20*c*.

The conductive pattern formed in the fan-out area 20*c* may be defined as a data line (or source line).

Each of the plurality of COFs 20*a* may output data signals for driving the pixels P arranged in at least one column.

In an embodiment, each of the plurality of COFs 20*a* may include a source IC chip 20*cd* for driving the plurality of substrates 22.

The source IC chip 20*cd* may process a signal received through the PCB 30. For example, the source IC chip 20*cd* may output an analog image signal based on processing digital image data.

The source IC chip 20*cd* may receive a power signal through the PCB 30. The source IC chip 20*cd* may operate based on the power signal received through the PCB 30.

In the manufacturing process of the display panel 20 according to an embodiment, a plurality of PCBs 30 may be coupled to the plurality of COFs 20*a*.

According to one or more embodiments, the plurality of COFs 20*a* may be connected to a single PCB 30.

For example, based on the drawing, the PCB 30 placed on the far left and the PCB 30 placed in the middle may each be connected to four COFs 20*a*, and the PCB 30 placed on the far right may be connected to three COFs 20*a*, but the connection relationship between the PCB 30 and the COFs 20*a* is not limited thereto.

According to an embodiment, in the manufacturing process of the display panel 20, at least one COF 20*a* of the plurality of COFs 20*a* may be connected to any one PCB 30, and at least one other COF 20*a* of the plurality of COFs 20*a* may be connected to another PCB 30.

For example, a first COF 20*al* of the plurality of COFs 20*a* may be coupled to a first PCB 30-1, and a second COF 20*a*2 of the plurality of COFs 20*a* may be coupled to a second PCB 30-2.

In another example, a third COF 20*a*3 of the plurality of COFs 20*a* may be coupled to the second PCB 30-2, and a fourth COF 20*a*4 of the plurality of COFs 20*a* may be coupled to a third PCB 30-3.

In the disclosure, a relationship between the COFs 20*a*, which are adjacent to each other but are connected to different PCBs 30, is defined as a 'pair of COFs'.

According to an embodiment, in the manufacturing process of the display panel 20, a conductive pattern 20*bpd* (see FIG. 10) may be formed in the OLB area 20*b* formed between the pair of COFs.

Figure 10:
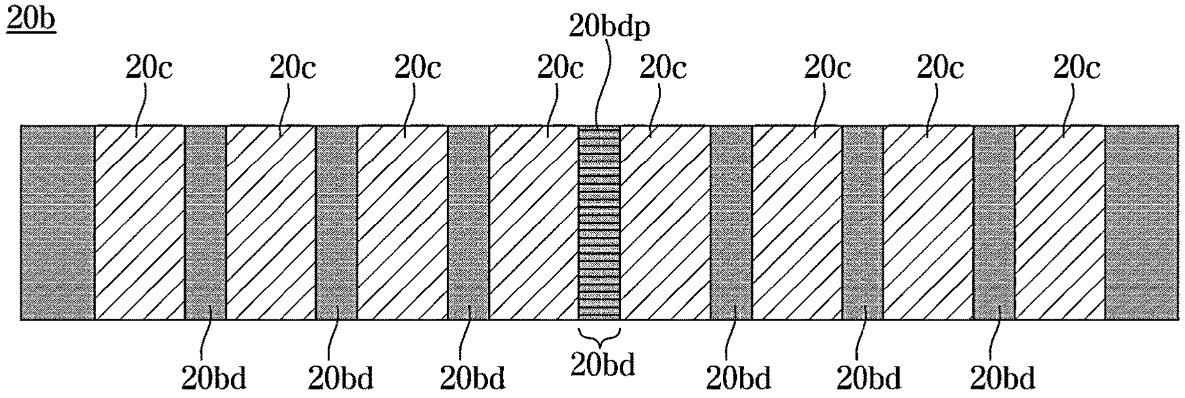
FIG. 10 illustrates an outer lead bonding (OLB) area of a display panel according to an embodiment.

According to one or more embodiments, the OLB area 20*b* formed between the pair of COFs may be defined as a dummy area 20*bd* (see FIG. 10).

For example, the OLB area 20*b* between the fan-out areas 20*c* of each of the pair of COFs may be defined as the dummy area 20*bd*.

Conventionally, because a COF is not coupled to a dummy area, no conductive pattern is formed. Accordingly, conventionally, a separate electronic component is required to electrically connect a plurality of PCBs.

According to one or more embodiments, the conductive pattern 20*bpd* for electrically connecting the pair of COFs may be formed in the dummy area 20*bd* between the fan-out areas 20*c* corresponding to each of the pair of COFs in the OLB area 20*b*.

The pair of COFs may be electrically connected to each other, and thus, the PCBs 30 connected to the pair of COFs may also be electrically connected.

For example, the conductive pattern 20*bpd* that may electrically connect the first COF 20*a*1 and the second COF 20*a*2 may be formed in the dummy area 20*bd* between the fan-out area 20*c* corresponding to the first COF 20*al* and the fan-out area 20*c* corresponding to the second COF 20*a*2 in the OLB area 20*b*. As a result, the first PCB 30-1 and the second PCB 30-2 may be electrically connected to each other.

In another example, the conductive pattern 20*bpd* that may electrically connect the third COF 20*a*3 and the fourth COF 20*a*4 may be formed in the dummy area 20*bd* between the fan-out area 20*c* corresponding to the third COF 20*a*3 and the fan-out area 20*c* corresponding to the fourth COF 20*a*4 in the OLB area 20*b*. As a result, the second PCB 30-2 and the third PCB 30-3 may be electrically connected to each other.

According to one or more embodiments, the conductive pattern 20*bpd* formed in the dummy area 20*bd* and/or the conductive pattern 20*bpd* formed in the fan-out area 20*c* may be formed on the substrate 22 in the manufacturing process of the substrate 22.

According to one or more embodiments, a conductive pattern may be formed on the substrate 22 with a copper (Cu)/copper (Cu) structure in order to reduce a resistance of the conductive pattern formed in the dummy area 20*bd*.

At least one PCB 30 of the plurality of PCBs 30 may be coupled to the control board 50 and/or the power board 60.

According to one or more embodiments, coupling at least one PCB 30 to the control board 50 and/or power board 60 may include physically coupling the PCB 30 to a connector of the control board 50 and/or the power board 60, as well as coupling the PCB 30 to a connector of the control board 50 and/or the power board 60 by another electronic component (e.g., Flexible Printed Circuit Board (FPCB)).

At least one PCB 30 of the plurality of PCBs 30 may not be coupled to the control board 50 and/or the power board 60.

Because only some of the plurality of PCBs 30 are coupled to the control board 50 and/or the power board 60, the PCB 30 that is not coupled to the control board 50 and/or the power board 60 30 may operate by receiving an electrical signal from the PCB 30 that is coupled to the control board 50 and/or the power board 60.

According to an embodiment, as the conductive pattern 20*bpd* is formed between the pair of COFs, the PCBs 30 may be electrically connected without a separate electronic component for connecting the PCBs 30.

In the manufacturing process of the display panel 20 according to an embodiment, a gate line GL may be formed in one side of the substrate 22.

The gate line GL may be a conductive pattern for transmitting a scan signal to the plurality of substrates 22.

The plurality of substrates 22 may operate in response to receiving the scan signal through the gate line GL.

The scan signal may be output through the gate line GL to sequentially operate the plurality of substrates 22.

According to one or more embodiments, any one COF 20*a* of the plurality of COFs 20*a* may be electrically connected to the gate line GL.

For example, a COF 20*af*, disposed at an edge where the gate line GL is located, from among the plurality of COFs 20*a* may be electrically connected to the gate line GL.

According to one or more embodiments, an edge portion where wiring (conductive pattern) is formed on the substrate 22 may be covered in a black matrix method, thereby preventing the wiring from being exposed to the outside.

Figure 6:
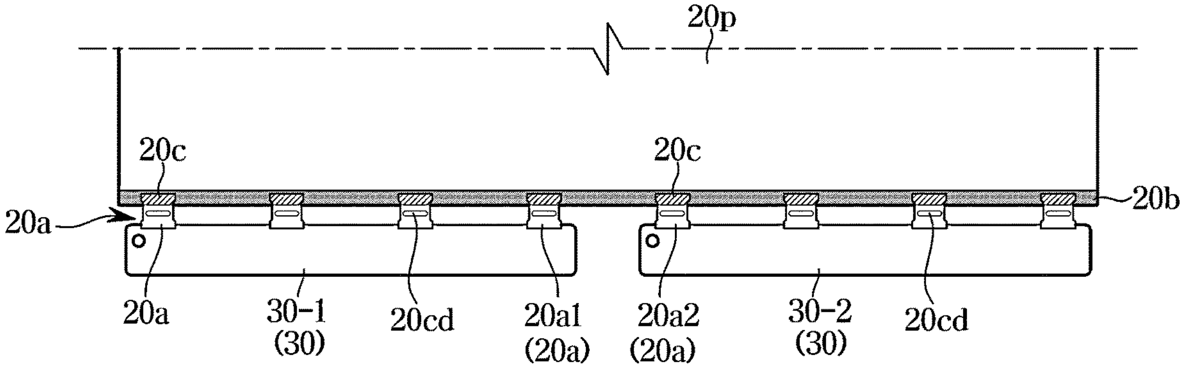
FIG. 6 illustrates one side of a display panel according to an embodiment.
Figure 7:
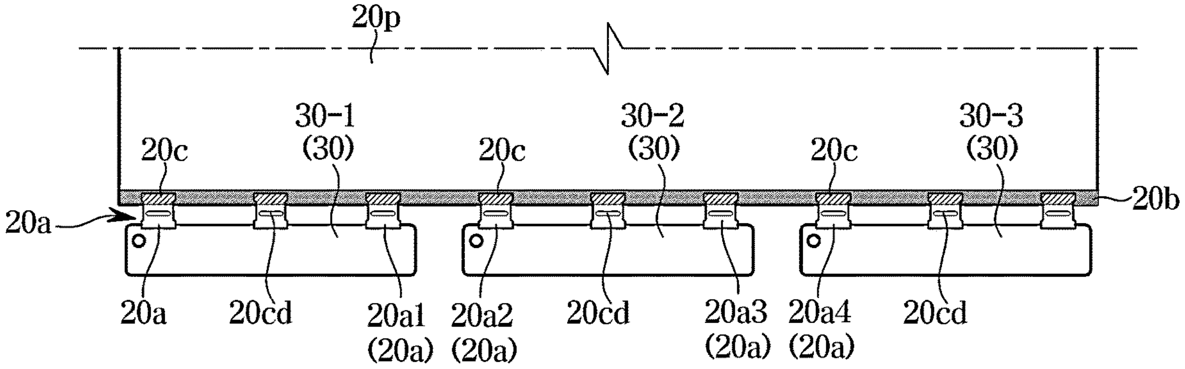
FIG. 7 illustrates one side of a display panel according to an embodiment.
Figure 8:
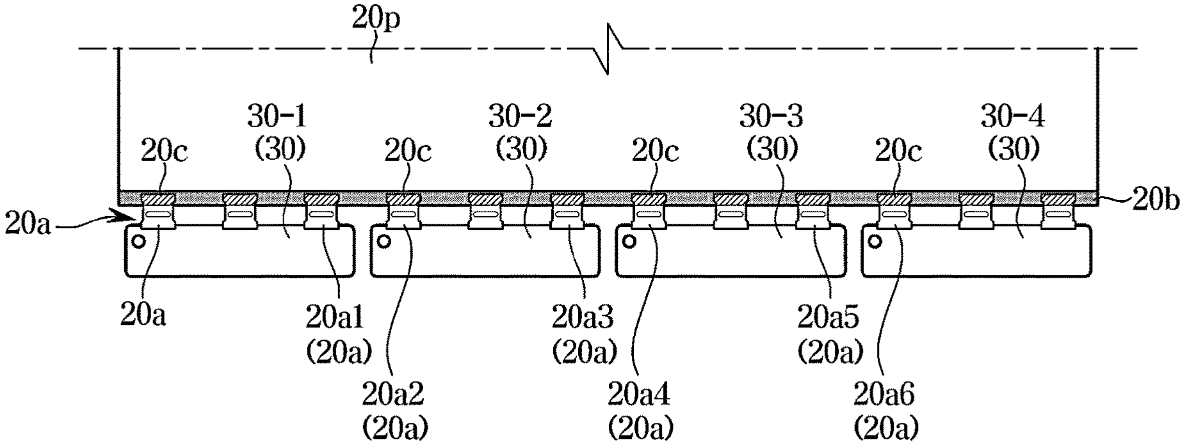
FIG. 8 illustrates one side of a display panel according to an embodiment.

FIG. 6 illustrates one side of a display panel according to an embodiment. FIG. 7 illustrates one side of a display panel according to an embodiment. FIG. 8 illustrates one side of a display panel according to an embodiment.

FIG. 6, FIG. 7, and FIG. 8 show embodiments in which the number of PCBs 30 and the number of COFs 20*a* of the display panel 20 are different from each other.

Referring to FIG. 6, FIG. 7, and FIG. 8, a plurality of COFs 20*a* may be coupled to the OLB area 20*b* provided on one side of the active area 20*p*.

For example, referring to FIG. 6, eight COFs 20*a* may be bonded to the OLB area 20*b*, and referring to FIG. 7, nine COFs 20*a* may be bonded to the OLB area 20*b*, and also referring to FIG. 8, twelve COFs 20*a* may be bonded to the OLB area 20*b*. However, the number of COFs 20*a* is not limited thereto.

The plurality of COFs 20*a* may be coupled to a plurality of PCBs 30. Each of the plurality of COFs 20*a* may include the source IC chip 20*cd*.

At least a portion of the COFs 20*a* from among the plurality of COFs 20*a* may be coupled to any one PCB 30, and the remaining COFs 20*a* may be coupled to another PCB 30. For example, referring to FIG. 6, among the eight COFs 20*a*, four COFs 20*a* may be coupled to one PCB 30, and the remaining four COFs 20*a* may be coupled to another PCB 30. However, according to one or more embodiments, three of the eight COFs 20*a* may be coupled to one PCB 30, and the remaining five COFs 20*a* may be coupled to another PCB 30.

The number of pair of COFs may vary depending on the number of PCBs 30. For example, in a case where two PCBs 30 are connected to the plurality of COFs 20*a*, the display panel 20 may include a pair of COFs.

In another example, referring to FIG. 7, three COFs 20*a* of the nine COFs 20*a* may be coupled to one PCB 30, another three COFs 20*a* may be coupled to another PCB 30, and the remaining three COFs 20*a* may be coupled to the remaining one PCB 30. However, according to one or more embodiments, two of the nine COFs 20*a* may be coupled to one PCB 30, another two COFs 20*a* may be coupled to another PCB 30, and the remaining five COFs 20*a* may be coupled to the remaining one PCB 30. For example, in a case where three PCBs 30 are connected to the plurality of COFs 20*a*, the display panel 20 may include two pairs of COFs.

In still another example, referring to FIG. 8, three COFs 20*a* of the twelve COFs 20*a* may be coupled to one PCB 30, another three COFs 20*a* may be coupled to another PCB 30, still another three COFs 20*a* may be coupled to still another PCB 30, and the remaining three COFs 20*a* may be coupled to the remaining one PCB 30. However, according to one or more embodiments, two COFs 20*a* of the twelve COFs 20*a* may be coupled to one PCB 30, three COFs 20*a* may be coupled to another PCB 30, four COFs 20*a* may be coupled to still another PCB 30, and the remaining three COFs 20*a* may be coupled to the remaining one PCB 30. For example, in a case where four PCBs 30 are connected to the plurality of COFs 20*a*, the display panel 20 may include three pairs of COFs.

The examples shown in FIG. 6, FIG. 7, and FIG. 8 are not intended to limit the embodiments of the disclosure, and the number of COFs 20*a* and the number of PCBs 30 included in the display panel 20, and a connection relationship among the COFs 20*a* and the PCBs 30 may be changed in various ways.

Figure 9:
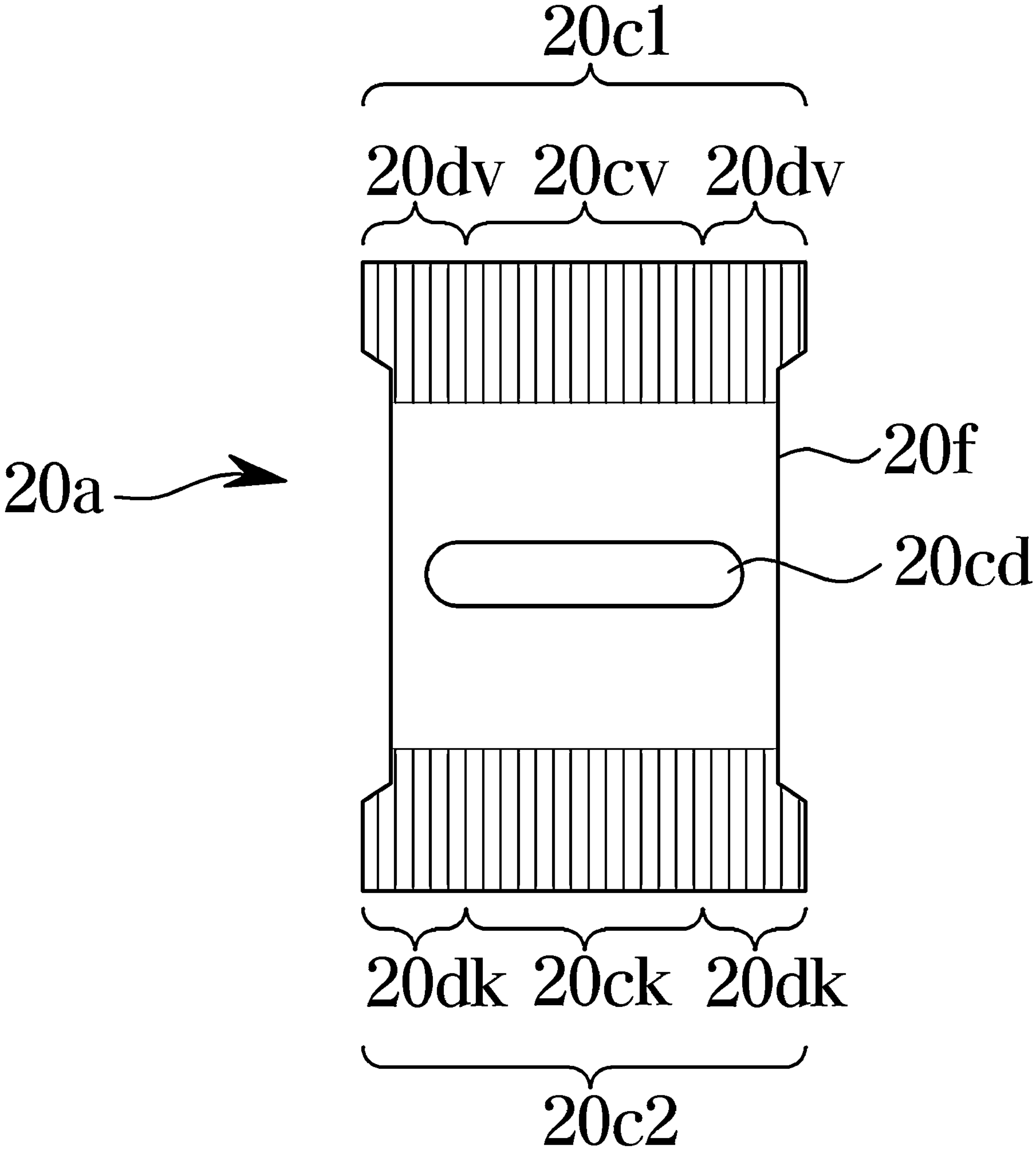
FIG. 9 illustrates a chip-on-film (COF) of a display panel according to an embodiment.

FIG. 9 illustrates a COF of a display panel according to an embodiment.

Referring to FIG. 9, the COF 20*a* according to an embodiment may include a flexible film 20*f*, the source IC chip 20*cd* mounted on the flexible film 20*f*, and a plurality of pins 20*c*1 and 20*c*2 provided on one side of the film 20*f*, respectively.

The flexible film 20*f* may include a printed circuit board and the plurality of pins 20*c*1 and 20*c*2.

The plurality of pins 20*c*1 and 20*c*2 may include a plurality of input pins 20*c*2 connectable to the PCB 30 and a plurality of output pins 20*c*1 coupled to the OLB area 20*b*.

According to one or more embodiments, the plurality of output pins 20*c*1 may include a plurality of valid output pins 20*cv* electrically connected to the pixels P provided in the active area 20*p*, and a plurality of dummy output pins 20*dv* that are not electrically connected to the pixels P provided in the active area 20*p*.

The plurality of valid output pins 20*cv* may be defined as signal pins, and may each be provided between the plurality of dummy output pins 20*dv*.

According to one or more embodiments, the plurality of valid output pins 20*cv* may be electrically connected to a data line, and the like, formed on the substrate 22.

In an embodiment, a plurality of dummy output pins 20*dv* of at least one COF 20*a* of the plurality of COFs 20*a* may not be connected to any conductive pattern.

In an embodiment, a plurality of dummy output pins 20*dv* of at least one COF 20*a* of the plurality of COFs 20*a* may be connected to a gate line GL.

For example, at least a portion of the dummy output pins 20*dv* of the COF 20*a*, provided on one side of the display panel 20 where the gate line GL is formed, may be connected to the gate line GL.

In an embodiment, a plurality of dummy output pins 20*dv* of a pair of COFs from among the plurality of COFs 20*a* may be electrically connected to each other by the conductive pattern 20*bpd* formed in the dummy area 20*bd*.

For example, a right dummy output pin 20*dv* of the COF 20*a* provided on the left in a pair of COFs may be electrically connected to a left dummy output pin 20*dv* of the COF 20*a* provided on the right in the pair of COFs through the conductive pattern 20*bpd*.

According to one or more embodiments, a plurality of dummy input pins 20*dk* and the plurality of dummy output pins 20*dv* may be connected to each other through the source IC chip 20*cd*. The source IC chip 20*cd* may be designed to transmit signals received from the plurality of dummy input pins 20*dk* to the plurality of dummy output pins 20*dv*, or to output signals received from the plurality of dummy output pins 20*dv* to the plurality of dummy input pins 20*dk*.

According to an embodiment, a dummy pin of a COF that is not used conventionally may be used, thereby achieving electrical connection between a pair of COFs. According to an embodiment, electrical connection between the PCBs 30 may be made without additional electronic components.

According to one or more embodiments, the plurality of input pins 20_c_2 may include a plurality of valid input pins 20_ck_ that are electrically connected to the PCB 30 and receive significant signals (e.g., power signals and/or data signals).

According to one or more embodiments, the plurality of input pins 20_c_2 may include the plurality of dummy input pins 20_dk_ that are not electrically connected to the PCB 30, or that are electrically connected to the PCB 30 but do not receive any signal.

The plurality of valid input pins 20_ck_ may be defined as signal pins, and may each be provided between the plurality of dummy input pins 20_dk_.

According to one or more embodiments, the plurality of valid input pins 20_ck_ may be electrically connected to a signal output pin of the PCB 30. The signal output pin of the PCB 30 may output a data signal and/or a power signal.

In an embodiment, a plurality of dummy input pins 20_dk_ of at least one COF 20_a_ of the plurality of COFs 20_a_ may be connected to the signal output pin of the PCB 30 and/or a signal reception pin of the PCB 30, but may not receive any signal from the signal output pin of the PCB 30, or may not output any signal to the signal reception pin of the PCB 30.

In an embodiment, a plurality of dummy input pins 20_dk_ of a pair of COFs from among the plurality of COFs 20_a_ may receive significant signals (e.g., data signal and/or power signal) from the signal output pin of the PCB 30, or may transmit significant signals (e.g., data signal and/or power signal) to the signal reception pin of the PCB 30.

For example, a right dummy input pin 20_dk_ of the COF 20_a_ provided on the left in a pair of COFs may receive a significant signal (e.g., data signal and/or power signal) from the PCB 30, and a left dummy input pin 20_dk_ of the COF 20_a_ provided on the right in the pair of COFs may transmit a significant signal (e.g., data signal and/or power signal) received from another PCB 30 to the PCB 30.

According to an embodiment, a pair of COFs may transmit and receive signals to and from each other using dummy pins.

FIG. 10 illustrates an OLB area of a display panel according to an embodiment.

Referring to FIG. 10, the OLB area 20_b_ may include the fan-out area 20_c_ and the dummy area 20_bd_.

The fan-out area 20_c_ is an area to which each of the plurality of COFs 20_a_ is coupled, and the fan-out areas 20_c_ may be formed alternately with the dummy areas 20_bd_ at a predetermined interval.

According to an embodiment, the fan-out area 20_c_ may include a plurality of fan-out areas 20_c_ separated from each other.

A single COF 20_a_ may be coupled to each of the plurality of fan-out areas 20_c_.

The dummy area 20_bd_ may be formed between each of the plurality of fan-out areas 20_c_ formed alternately.

Accordingly, the dummy area 20_bd_ may include a plurality of dummy areas 20_bd_ separated from each other.

According to one or more embodiments, the conductive pattern 20_bpd_ connected to the fan-out areas 20_c_ provided on both sides may be formed in at least one dummy area 20_bd_ of the plurality of dummy areas 20_bd_.

According to one or more embodiments, the conductive pattern 20_bpd_ may be formed in the dummy area 20_bd_ formed between a pair of fan-out areas 20_c_, coupled to a pair of COFs, from among the plurality of dummy areas 20_bd_.

According to an embodiment, an electrical path between a pair of COFs may be formed by forming the conductive pattern 20_bpd_ in a portion of the dummy areas 20_bd_ in the OLB area 20_b_ of the substrate 22.

Figure 11:
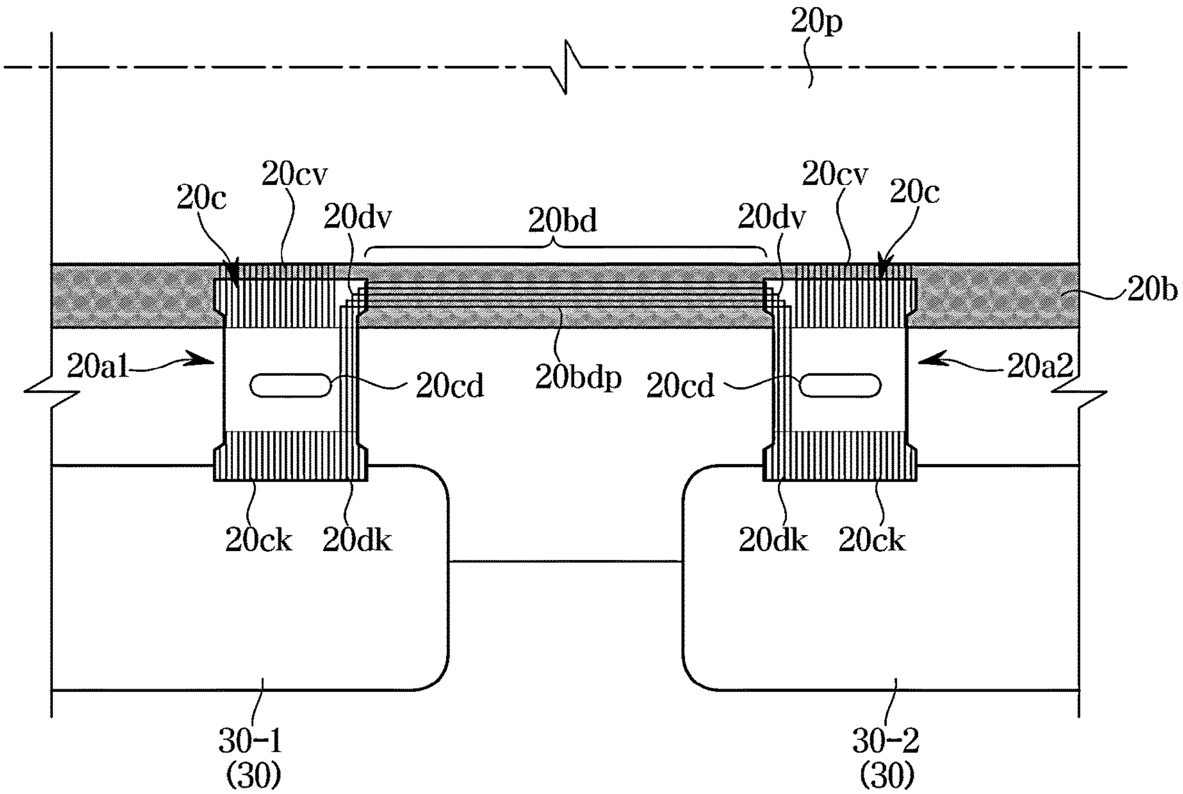
FIG. 11 schematically illustrates that COFs of a display panel according to an embodiment are electrically connected by a conductive pattern formed in an OLB area.

FIG. 11 schematically illustrates that COFs of a display panel according to an embodiment are electrically connected by a conductive pattern formed in an OLB area.

Referring to FIG. 11, a relationship between a pair of COFs coupled to the OLB area 20_b_ may be confirmed.

According to an embodiment, the first COF 20_al_ and the second COF 20_a_2 may be coupled to the OLB area 20_b_.

The first COF 20_al_ and the second COF 20_a_2 may form a pair COF relationship with each other.

For example, the first COF 20_a_1 and the second COF 20_a_2 may be provided in the OLB area 20_b_, be provided adjacent to each other, and be coupled to different PCBs 30-1 and 30-2.

The OLB area 20_b_ may include a first area (fan-out area 20_c_) to which the first COF 20_a_1 is coupled, a second area (fan-out area 20_c_) to which the second COF 20_a_2 is coupled, and a dummy area 20_bd_ between the first area and the second area.

The first COF 20_a_1 may be connected to the first PCB 30-1. The second COF 20_a_2 may be connected to the second PCB 30-2.

The first PCB 30-1 or the second PCB 30-2 may be coupled to the control board 50 and/or the power board 60.

The plurality of valid input pins 20_ck_ of the first COF 20_al_ may receive a data signal and/or power signal from the first PCB 30-1.

The data signal and/or power signal may correspond to a signal received by the first PCB 30-1 through the control board 50 and/or power board 60.

According to one or more embodiments, the plurality of valid input pins 20_ck_ of the first COF 20_a_1 may receive data signals corresponding to data values of pixels P provided in at least one column corresponding to the first COF 20_a_1.

The source IC chip 20_cd_ of the first COF 20_al_ may output a signal for driving the plurality of substrates 22 through the plurality of valid output pins 20_cv_, based on processing the signal received through the plurality of valid input pins 20_ck_.

The plurality of valid output pins 20_cv_ may be connected to a data line and/or a power line formed in the active area 20_p_.

The plurality of dummy input pins 20_dk_ of the first COF 20_a_1 may receive a data signal and/or a power signal from the first PCB 30-1.

According to one or more embodiments, the plurality of dummy input pins 20_dk_ of the first COF 20_a_1 may receive data signals corresponding to data values of the pixels P provided in at least one column corresponding to the second PCB 30-2.

The data signal and/or power signal received from the first PCB 30-1 through the plurality of dummy input pins 20_dk_ may be output through the plurality of dummy output pins 20_dv_.

The plurality of dummy output pins 20_dv_ may be connected to the plurality of dummy output pins 20_dv_ of the second COF 20_a_2 through the conductive pattern 20_bpd_ formed in the dummy area 20_bd_.

The plurality of dummy output pins 20_dv_ of the second COF 20_a_2 may output the data signal and/or power signal, received through the conductive pattern 20_bpd_, through the plurality of dummy input pins 20_dk_.

Based on processing the data signal and/or power signal output by the plurality of dummy input pins 20_dk_ of the second COF 20_a_2, the second PCB 30-2 may transmit the data signal and/or power signal to the source IC chip 20*cd* of the second COF 20*a*2 through the plurality of valid input pins 20*ck*.

Based on processing the signal received through the plurality of valid input pins 20*ck*, the source IC chip 20*cd* of the second COF 20*a*2 may output a signal for driving the plurality of substrates 22 through the plurality of valid output pins 20*cv*. The plurality of valid output pins 20*cv* may be connected to a data line and/or a power line formed in the active area 20*p*.

According to an embodiment, the power signal and/or data signal may be transmitted to the second PCB 30-2 without a separate electronic component for connecting the first PCB 30-1 and the second PCB 30-2.

Figure 12:
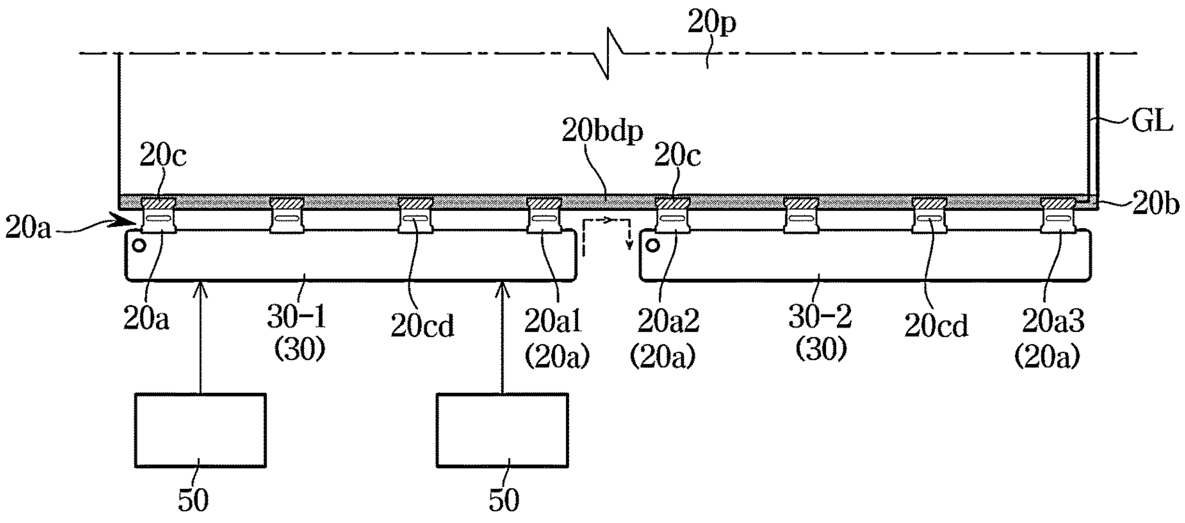
FIG. 12 illustrates an exemplary flow of a signal in one side of a display panel according to an embodiment.
Figure 13:
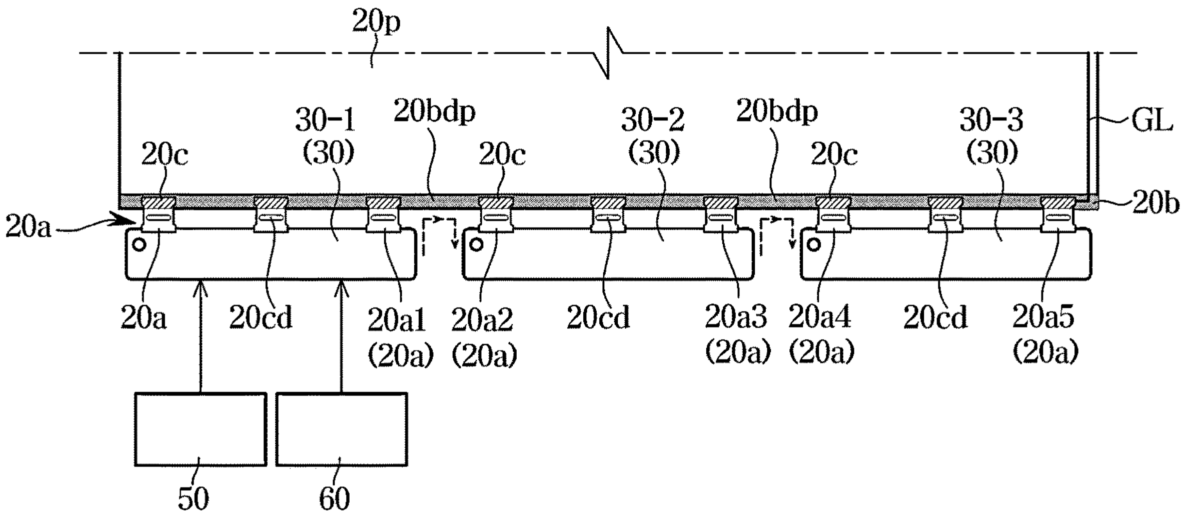
FIG. 13 illustrates an exemplary flow of a signal in one side of a display panel according to an embodiment.
Figure 14:
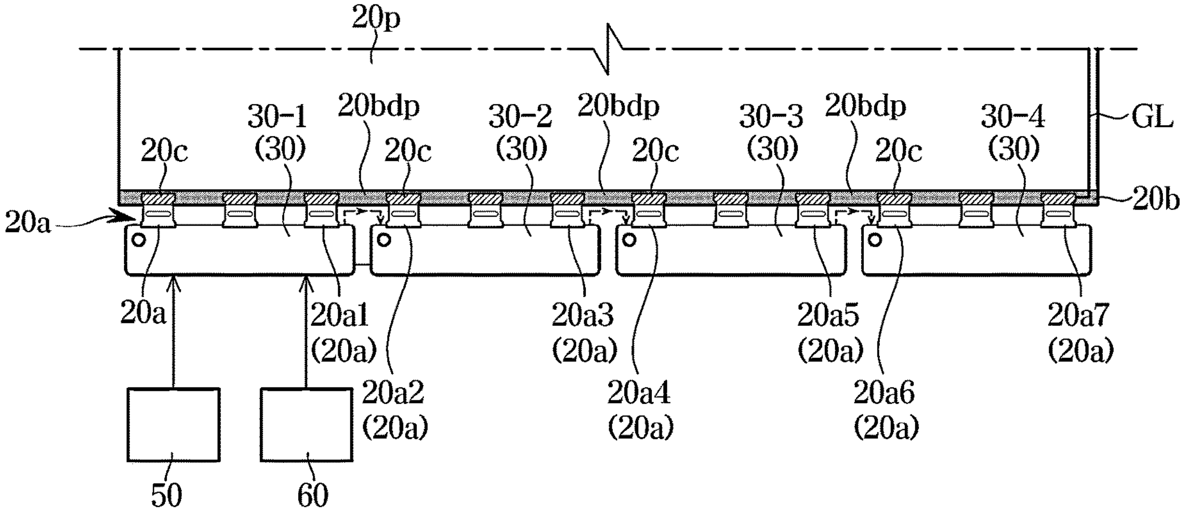
FIG. 14 illustrates an exemplary flow of a signal in one side of a display panel according to an embodiment.

FIG. 12 illustrates an exemplary flow of a signal in one side of a display panel according to an embodiment. FIG. 13 illustrates an exemplary flow of a signal in one side of a display panel according to an embodiment. FIG. 14 illustrates an exemplary flow of a signal in one side of a display panel according to an embodiment.

Referring to FIG. 12, the first PCB 30-1 electrically coupled to the control board 50 and/or the power board 60 may be coupled to a plurality of COFs 20*a*, and the plurality of COFs 20*a* coupled to the first PCB 30-1 may include the first COF 20*a*1 closest to a plurality of COFs 20*a* coupled to the second PCB 30-2.

The second PCB 30-2 may be coupled to the plurality of COFs 20*a*, and the plurality of COFs 20*a* coupled to the second PCB 30-2 may include the second COF 20*a*2 closest to the plurality of COFs 20*a* coupled to the first PCB 30-1.

A signal transmitted through the control board 50 and/or the power board 60 may be transmitted to the second PCB 30-2 through the dummy pins 20*dk* and 20*dv* of the first COF 20*a*1, the conductive pattern 20*bpd* formed in the dummy area 20*bd*, and the dummy pins 20*dk* and 20*dv* of the second COF 20*a*2.

According to one or more embodiments, the second PCB 30-2 may be coupled to the third COF 20*a*3 provided on one side of the substrate 22 adjacent to a gate line GL.

The third COF 20*a*3 may transmit a scan signal to the gate line GL.

In an embodiment, the source IC chip 20*cd* of the third COF 20*a*3 may output the scan signal through the plurality of dummy output pins 20*dv*.

Referring to FIG. 13, the first PCB 30-1 electrically coupled to the control board 50 and/or the power board 60 may be coupled to a plurality of COFs 20*a*, and the plurality of COFs 20*a* coupled to the first PCB 30-1 may include the first COF 20*a*1 closest to a plurality of COFs 20*a* coupled to the second PCB 30-2.

The second PCB 30-2 may be coupled to the plurality of COFs 20*a*, and the plurality of COFs 20*a* coupled to the second PCB 30-2 may include the second COF 20*a*2 closest to the plurality of COFs 20*a* coupled to the first PCB 30-1.

The second PCB 30-2 may be coupled to the plurality of COFs 20*a*, and the plurality of COFs 20*a* coupled to the second PCB 30-2 may include the third COF 20*a*3 closest to a plurality of COFs 20*a* coupled to the third PCB 30-3.

The third PCB 30-3 may be coupled to the plurality of COFs 20*a*, and the plurality of COFs 20*a* coupled to the third PCB 30-3 may include the fourth COF 20*a*4 closest to the plurality of COFs 20*a* coupled to the second PCB 30-2.

A signal transmitted through the control board 50 and/or the power board 60 may be transmitted to the second PCB 30-2 through the dummy pins 20*dk* and 20*dv* of the first COF 20*a*1, the conductive pattern 20*bpd* formed in the dummy area 20*bd* between the fan-out area 20*c* corresponding to the first COF 20*a*1 and the fan-out area 20*c* corresponding to the second COF 20*a*2, and the dummy pins 20*dk* and 20*dv* of the second COF 20*a*2.

The signal transmitted through the control board 50 and/or the power board 60 may be transmitted to the third PCB 30-3 through the second PCB 30-2, the dummy pins 20*dk* and 20*dv* of the third COF 20*a*3, the conductive pattern 20*bpd* formed in the dummy area 20*bd* between the fan-out area 20*c* corresponding to the third COF 20*a*3 and the fan-out area 20*c* corresponding to the fourth COF 20*a*4, and the dummy pins 20*dk* and 20*dv* of the fourth COF 20*a*4.

According to one or more embodiments, the third PCB 30-3 may be coupled to a fifth COF 20*a*5 provided on one side of the substrate 22 adjacent to the gate line GL.

The fifth COF 20*a*5 may transmit the scan signal to the gate line GL.

In an embodiment, the source IC chip 20*cd* of the fifth COF 20*a*5 may output the scan signal through the plurality of dummy output pins 20*dv*.

Referring to FIG. 14, the first PCB 30-1 electrically coupled to the control board 50 and/or the power board 60 may be coupled to a plurality of COFs 20*a*, and the plurality of COFs 20*a* coupled to the first PCB 30-1 may include the first COF 20*a*1 closest to a plurality of COFs 20*a* coupled to the second PCB 30-2.

The second PCB 30-2 may be coupled to the plurality of COFs 20*a*, and the plurality of COFs 20*a* coupled to the second PCB 30-2 may include the second COF 20*a*2 closest to the plurality of COFs 20*a* coupled to the first PCB 30-1.

The second PCB 30-2 may be coupled to the plurality of COFs 20*a*, and the plurality of COFs 20*a* coupled to the second PCB 30-2 may include the third COF 20*a*3 closest to a plurality of COFs 20*a* coupled to the third PCB 30-3.

The third PCB 30-3 may be coupled to the plurality of COFs 20*a*, and the plurality of COFs 20*a* coupled to the third PCB 30-3 may include the fourth COF 20*a*4 closest to the plurality of COFs 20*a* coupled to the second PCB 30-2.

The third PCB 30-3 may be coupled to the plurality of COFs 20*a*, and the plurality of COFs 20*a* coupled to the third PCB 30-3 may include the fifth COF 20*a*5 closest to a plurality of COFs 20*a* coupled to the fourth PCB 30-4.

The fourth PCB 30-4 may be coupled to the plurality of COFs 20*a*, and the plurality of COFs 20*a* coupled to the fourth PCB 30-4 may include a sixth COF 20*a*6 closest to the plurality of COFs 20*a* coupled to the third PCB 30-3.

A signal transmitted through the control board 50 and/or the power board 60 may be transmitted to the second PCB 30-2 through the dummy pins 20*dk* and 20*dv* of the first COF 20*a*1, the conductive pattern 20*bpd* formed in the dummy area 20*bd* between the fan-out area 20*c* corresponding to the first COF 20*a*1 and the fan-out area 20*c* corresponding to the second COF 20*a*2, and the dummy pins 20*dk* and 20*dv* of the second COF 20*a*2.

The signal transmitted through the control board 50 and/or the power board 60 may be transmitted to the third PCB 30-3 through the second PCB 30-2, the dummy pins 20*dk* and 20*dv* of the third COF 20*a*3, the conductive pattern 20*bpd* formed in the dummy area 20*bd* between the fan-out area 20*c* corresponding to the third COF 20*a*3 and the fan-out area 20*c* corresponding to the fourth COF 20*a*4, and the dummy pins 20*dk* and 20*dv* of the fourth COF 20*a*4.

The signal transmitted through the control board 50 and/or the power board 60 may be transmitted to the fourth PCB 30-4 through the third PCB 30-3, the dummy pins 20*dk* and 20*dv* of the fifth COF 20*a*5, the conductive pattern 20*bpd* formed in the dummy area 20*bd* between the fan-out area 20*c* corresponding to the fifth COF 20*a*5 and the fan-out area 20*c* corresponding to the sixth COF 20*a*6, and the dummy pins 20*dk* and 20*dv* of the sixth COF 20*a*6.

According to one or more embodiments, the fourth PCB 30-4 may be coupled to a seventh COF 20*a*7 provided on one side of the substrate 22 adjacent to the gate line GL.

The seventh COF 20*a*7 may transmit the scan signal to the gate line GL.

In an embodiment, the source IC chip 20*cd* of the seventh COF 20*a*7 may output the scan signal through the plurality of dummy output pins 20*dv*.

According to an embodiment, in a case where the display panel 20 includes a plurality of PCBs 30, the plurality of PCBs 30 may be electrically connected using the dummy area 20*bd* of the OLB area 20*b* without a separate electronic component.

According to one or more embodiments, although it is assumed in FIG. 12 to FIG. 14 that the PCB 30 connected to the control board 50 and/or the power board 60 is the first PCB 30-1, the PCB 30 connected to the control board 50 and/or the power board 60 may be another PCB 30 other than the first PCB 30-1.

In an embodiment, the PCB 30 connected to the control board 50 and/or the power board 60 may transmit a signal to an adjacent PCB 30 through the COF 20*a* that is located outermost among the plurality of COFs 20*a* connected thereto, and through the conductive pattern 20*bpd* formed in the dummy area 20*bd* located next to the fan-out area 20*c* corresponding to the COF 20*a* located outermost.

For example, in a case where the PCB 30 connected to the control board 50 and/or the power board 60 is the second PCB 30-2, the second PCB 30-2 may transmit a signal to the first PCB 30-1 through the conductive pattern 20*bpd* formed in the dummy area 20*bd* between the fan-out area 20*c* corresponding to the second COF 20*a*2 and the fan-out area 20*c* corresponding to the first COF 20*al*, and may transmit the signal to the third PCB 30-3 through the conductive pattern 20*bpd* formed in the dummy area 20*bd* between the fan-out area 20*c* corresponding to the third COF 20*a*3 and the fan-out area 20*c* corresponding to the fourth COF 20*a*4.

Figure 15:
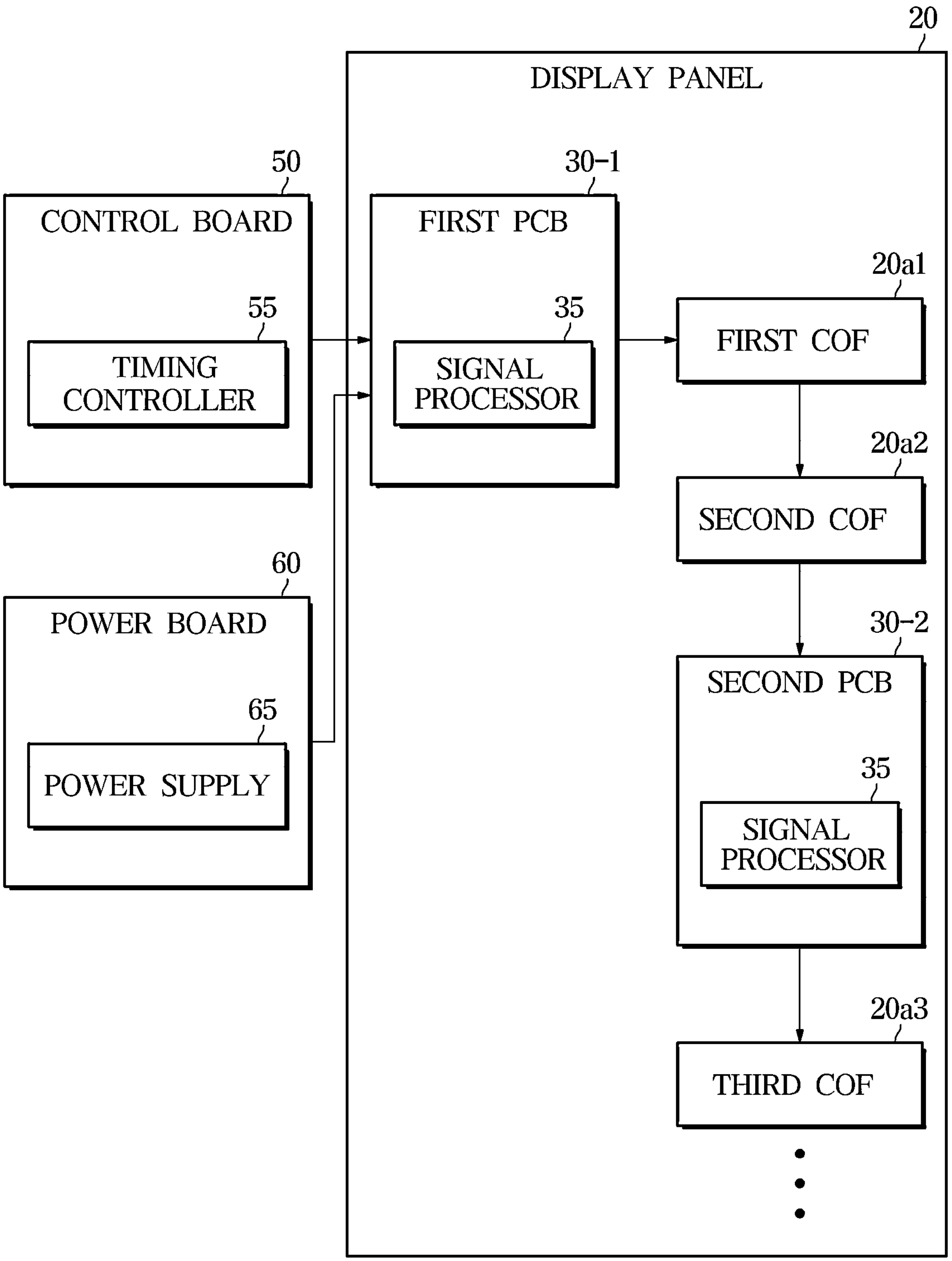
FIG. 15 illustrates an example of a control block diagram of a display apparatus according to an embodiment.

FIG. 15 illustrates an example of a control block diagram of the display apparatus 10 according to an embodiment.

Referring to FIG. 15, the display apparatus 10 may include the control board 50, the power board 60, and the display panel 20.

The rear substrate 16 (see FIG. 2) may include the control board 50 and/or the power board 60.

The control board 50 may include a timing controller 55. For example, the control board 50 may include a control PCB including the timing controller 55.

The power board 60 may include a power supply 65. The power supply 65 may supply power supplied from an external power source to the display apparatus 10. For example, the power supply 65 may process (e.g., rectify, reduce noise) a voltage supplied from an external power source and transmit the processed voltage to an electronic component (e.g., the PCB 30) included in the display apparatus 10.

The substrate 22 of the display panel 20 may include the active area 20*p* and the OLB area 20*b*.

The display apparatus 10 may include a tuner and a receiving terminal for receiving content including a video signal and/or an audio signal from content sources.

The receiving terminal may receive the video signal and audio signal from content sources through a cable. For example, the receiving terminal may include a component (YPbPr/RGB) terminal, a Composite Video Blanking and Sync (CVBS) terminal, an audio terminal, a High-Definition Multimedia Interface (HDMI) terminal, and a Universal Serial Bus (USB) terminal.

The tuner may receive a broadcast signal from a broadcast reception antenna or a wired cable. In addition, the tuner may extract a broadcast signal of a channel selected by a user from among broadcast signals. For example, the tuner may pass a broadcast signal having a frequency corresponding to the channel selected by the user among a plurality of broadcast signals received through the broadcast reception antenna or wired cable, and may block a broadcast signal having a different frequency.

As described above, a content receiver may receive the video signal and/or audio signal from the content sources through the receiving terminal and/or the tuner. The content receiver may output the video signal and/or audio signal received through the receiving terminal and/or the tuner to an image processor. Based on processing the video signal and/or audio signal from the content receiver, the image processor may transmit image data to the timing controller 55.

The timing controller 55 may receive the image data from the image processor. The timing controller 55 may output the image data and a driving control signal to the first PCB 30-1. The driving control signal may include a scan control signal and a data control signal. The scan control signal and the data control signal may be used to control operations of a scan driver and a data driver, respectively.

The first PCB 30-1 may receive the scan control signal and the data control signal from the timing controller 55.

The first PCB 30-1 may receive a power signal from the power supply 65.

The first PCB 30-1 may include a signal processor 35 for processing the data control signal and the scan control signal received from the timing controller 55 and/or the power signal received from the power supply 65.

For example, the signal processor 35 may have a configuration for improving an electromagnetic interface (EMI) of the data control signal and the scan control signal received from the timing controller 55 and/or for converting a digital signal into an analog signal.

For example, the signal processor 35 may include a power IC for processing the power signal received from the power supply 65.

The first PCB 30-1 may output the processed signal to the plurality of COFs 20*a* connected to the first PCB 30-1, and the source IC chip 20*cd* included in each of the plurality of COFs 20*a* 20*cd* may output signals for driving a plurality of pixels P based on the signal output from the first PCB 30-1.

According to one or more embodiments, the first PCB 30-1 may transmit, to the second PCB 30-2, the scan control signal and the data control signal received from the timing controller 55 through the first COF 20*a*1.

According to one or more embodiments, the first PCB 30-1 may transmit the power signal received from the power supply 65 to the second PCB 30-2 through the first COF 20*a*1.

For example, the first PCB 30-1 may transmit, to the second PCB 30-2, the scan control signal, the data control signal and/or the power signal through the first COF 20*a*1, the conductive pattern 20*bpd* between the first COF 20*al* and the second COF 20*a*2, and the second COF 20*a*2.

The second PCB 30-2 may process the data control signal and the scan control signal received from the first PCB 30-1, and may output the processed signal to the plurality of COFs 20*a* connected to the second PCB 30-2.

The second PCB 30-2 may operate based on the power signal received from the first PCB 30-1.

In an embodiment, where the display apparatus 10 includes three or more PCBs 30, the second PCB 30-2 may also transmit, to the third PCB 30-3, the scan control signal, data control signal and/or power signal through the third COF **20*a*3**.

According to an embodiment, a separate electronic component for connecting the PCBs 30 is not required, thereby reducing a cost of the display apparatus.

Further, according to an embodiment, economic loss caused by damage to a separate electronic component for connecting the PCBs 30 may be prevented.

According to an embodiment, the display panel may include the substrate 22 including the active area **20*p* including a plurality of pixels P, and the OLB area 20*b*; the first COF 20*a*1 coupled to the OLB area: the second COF 20*a*2 coupled to the OLB area and be adjacent to the first COF: the first PCB 30-1 coupled to the first COF; and the second PCB 30-2 coupled to the second COF, wherein the OLB area may include a first area to which the first COF is coupled, a second area to which the second COF is coupled, and the dummy area 20*bd* between the first area and the second area, and the dummy area may include the conductive pattern 20*bpd*** for electrically connecting the first COF and the second COF.

According to an embodiment, each of the first COF and the second COF may include: a plurality of signal pins configured to output signals for driving the plurality of pixels; and a plurality of dummy pins, and the plurality of dummy pins of the first COF may be configured to be electrically connected to the plurality of dummy pins of the second COF through the conductive pattern.

According to an embodiment, each of the plurality of signal pins may be configured to be provided between the plurality of dummy pins.

According to an embodiment, the first COF may be configured to transmit a power signal to the second COF through the conductive pattern, and the second COF may be configured to transmit the power signal to the second PCB.

According to an embodiment, the first COF may be configured to transmit a data signal to the second COF through the conductive pattern, and the second COF may be configured to transmit the data signal to the second PCB.

According to an embodiment, the display panel may further include a third COF coupled to the OLB area and the first PCB, and the substrate may include a gate line for transmitting a gate signal to the plurality of pixels, and the gate line may be configured to be electrically connected to the third COF.

According to an embodiment, the display panel may further include a third PCB; a third COF coupled to the OLB area and the second PCB; and a fourth COF coupled to the OLB area and the third PCB, wherein the OLB area may include a third area to which the third COF is coupled, a fourth area to which the fourth COF is coupled, and the dummy area between the third area and the fourth area, and the dummy area may include a conductive pattern for electrically connecting the third COF and the fourth COF.

According to an embodiment, each of the first COF and the second COF may include a source IC chip.

According to an embodiment, the second PCB may be configured to receive a signal from the first PCB through the first COF, the conductive pattern and the second COF.

According to an embodiment, the display apparatus 10 may include the first substrate 16 including the timing controller 55; the second substrate 22 including the active area **20*p* including a plurality of pixels P and the OLB area 20*b*; the first COF 20*a*1 coupled to the OLB area: the second COF 20*a*2 coupled to the OLB area and be adjacent to the first COF; the first PCB 30-1 coupled to the timing controller and the first COF; and the second PCB 30-2 coupled to the second COF, wherein the OLB area may include a first area to which the first COF is coupled, a second area to which the second COF is coupled, and the dummy area 20*bd* between the first area and the second area, and the dummy area may include the conductive pattern 20*bpd*** for electrically connecting the first COF and the second COF.

According to an embodiment, each of the first COF and the second COF may include: a plurality of signal pins configured to output signals for driving the plurality of pixels; and a plurality of dummy pins, and the plurality of dummy pins of the first COF may be configured to be electrically connected to the plurality of dummy pins of the second COF through the conductive pattern.

According to an embodiment, each of the plurality of signal pins may be configured to be provided between the plurality of dummy pins According to an embodiment, the first substrate may further include a power board coupled to the first PCB, the power board may be configured to transmit a power signal to the first PCB, the first COF may be configured to transmit the power signal to the second PCB through the conductive pattern, and the second COF may be configured to transmit the power signal to the second PCB.

According to an embodiment, the timing controller may be configured to transmit a data signal to the first PCB, the first COF may be configured to transmit the data signal to the second COF through the conductive pattern, and the second COF may be configured to transmit the data signal to the second PCB.

According to an embodiment, the display apparatus may further include a third COF coupled to the OLB area and the first PCB, wherein the second substrate may include a gate line for transmitting a gate signal to the plurality of pixels, and the gate line may be configured to be electrically connected to the third COF.

According to an embodiment, the display apparatus may further include a third PCB; a third COF coupled to the OLB area and the second PCB; and a fourth COF coupled to the OLB area and the third PCB, wherein the OLB area may include a third area to which the third COF is coupled, a fourth area to which the fourth COF is coupled, and the dummy area between the third area and the fourth area, and the dummy area may include a conductive pattern for electrically connecting the third COF and the fourth COF.

According to an embodiment, each of the first COF and the second COF may include a source IC chip.

According to an embodiment, the first PCB may be configured to receive a control signal from the timing controller, and the second PCB may be configured to receive the control signal from the first PCB through the first COF, the conductive pattern and the second COF.

According to an embodiment, the first substrate may further include a power board coupled to the first PCB, the first PCB may be configured to receive a power signal from the power board, and the second PCB may be configured to receive the power signal from the first PCB through the first COF, the conductive pattern and the second COF.

According to an embodiment, a method for manufacturing the display panel 20 may include: disposing a plurality of pixels P in the active area **20*p* of the substrate 22: coupling a plurality of COFs 20*a* to the fan-out area 20*c* in the OLB area 20*b*; forming the conductive pattern 20*bpd* in the predetermined dummy area 20***bd* surrounded by the fan-out area in the OLB area: coupling the first PCB 30-1 to the first COF 20*a*1, coupled to one side of the fan-out area based on the predetermined dummy area, among the plurality of COFs; and coupling the second PCB 30-2 to the second COF 20*a*2, coupled to another side of the fan-out area based on the predetermined dummy area, among the plurality of COFs.

Although certain embodiments the disclosure has been shown and described in relation to specific embodiments, it would be appreciated by those skilled in the art that changes and modifications may be made in these embodiments without departing from the principles and scope of the disclosure, the scope of which is defined in the claims and their equivalents.

What is claimed is:

1. A display panel comprising:

a substrate comprising an active area comprising a plurality of pixels, and an outer lead bonding (OLB) area;

a first Chip On Film (COF) coupled to the OLB area;

a second COF coupled to the OLB area and adjacent to the first COF;

a first printed circuit board (PCB) coupled to the first COF; and a second PCB coupled to the second COF, wherein the OLB area comprises a first area to which the first COF is coupled, a second area to which the second COF is coupled, and a dummy area between the first area and the second area, and wherein the dummy area comprises a conductive pattern electrically connecting the first COF and the second COF, wherein each of the first COF and the second COF comprises:

a plurality of signal pins configured to output signals for driving the plurality of pixels; and a plurality of dummy pins, and wherein the plurality of dummy pins of the first COF are electrically connected to the plurality of dummy pins of the second COF through the conductive pattern.

2. The display panel of claim 1, wherein each of the plurality of signal pins is provided between the plurality of dummy pins.

3. The display panel of claim 1, wherein the first COF is configured to transmit a power signal to the second COF through the conductive pattern, and wherein the second COF is configured to transmit the power signal to the second PCB.

4. The display panel of claim 1, wherein the first COF is configured to transmit a data signal to the second COF through the conductive pattern, and wherein the second COF is configured to transmit the data signal to the second PCB.

5. The display panel of claim 1, further comprising:

a third COF coupled to the OLB area and the first PCB, wherein the substrate comprises a gate line configured to transmit a gate signal to the plurality of pixels, and wherein the gate line is electrically connected to the third COF.

6. The display panel of claim 1, further comprising:

a third PCB;

a third COF coupled to the OLB area and the second PCB; and a fourth COF coupled to the OLB area and the third PCB, wherein the OLB area comprises a third area to which the third COF is coupled, a fourth area to which the fourth COF is coupled, and the dummy area between the third area and the fourth area, and wherein the dummy area further comprises a conductive pattern electrically connecting the third COF and the fourth COF.

7. The display panel of claim 1, wherein each of the first COF and the second COF comprises a source integrated circuit (IC) chip.

8. The display panel of claim 1, wherein the second PCB is configured to receive a signal from the first PCB through the first COF, the conductive pattern and the second COF.

9. A display apparatus comprising:

a first substrate comprising a timing controller;

a second substrate comprising an active area including a plurality of pixels, and an outer lead bonding (OLB) area;

a first chip on film (COF) coupled to the OLB area;

a second COF coupled to the OLB area and adjacent to the first COF;

a first printed circuit board (PCB) coupled to the timing controller and the first COF; and a second PCB coupled to the second COF, wherein the OLB area comprises a first area to which the first COF is coupled, a second area to which the second COF is coupled, and a dummy area between the first area and the second area, and wherein the dummy area comprises a conductive pattern electrically connecting the first COF and the second COF, wherein each of the first COF and the second COF comprises:

a plurality of signal pins configured to output signals for driving the plurality of pixels; and a plurality of dummy pins, and wherein the plurality of dummy pins of the first COF are electrically connected to the plurality of dummy pins of the second COF through the conductive pattern.

10. The display apparatus of claim 9, wherein each of the plurality of signal pins is provided between the plurality of dummy pins.

11. The display apparatus of claim 9, wherein the first substrate further comprises a power board coupled to the first PCB, wherein the power board is configured to transmit a power signal to the first PCB, wherein the first COF is configured to transmit the power signal to the second COF through the conductive pattern, and wherein the second COF is configured to transmit the power signal to the second PCB.

12. The display apparatus of claim 9, wherein the timing controller is configured to transmit a data signal to the first PCB, wherein the first COF is configured to transmit the data signal to the second COF through the conductive pattern, and wherein the second COF is configured to transmit the data signal to the second PCB.

13. The display apparatus of claim 9, further comprising:

a third COF coupled to the OLB area and the first PCB, wherein the second substrate comprises a gate integrated circuit (IC) configured to transmit a gate signal to the plurality of pixels, and wherein the gate IC is electrically connected to the third COF.

* * * * *